US012740324B2

(12) United States Patent
Mitsui et al.

(10) Patent No.: US 12,740,324 B2
(45) Date of Patent: Sep. 15, 2026

(54) PIEZOELECTRIC ELEMENT INCLUDING A PIEZOELECTRIC ELEMENT BODY, AN EXTERNAL ELECTRODE AND AN INTERNAL ELECTRODE

(71) Applicant: TDK Corporation, Tokyo (JP)

(72) Inventors: Hiroki Mitsui, Tokyo (JP); Hideya Sakamoto, Tokyo (JP); Yoshiki Ohta, Tokyo (JP); Miho Kato, Tokyo (JP); Hiroyuki Ijiri, Tokyo (JP); Akihiro Takeda, Tokyo (JP)

(73) Assignee: TDK CORPORATION, Tokyo (JP)

( * ) Notice: Subject to any disclaimer, the term of this patent is extended or adjusted under 35 U.S.C. 154(b) by 854 days.

(21) Appl. No.: 18/182,851

(22) Filed: Mar. 13, 2023

(65) Prior Publication Data

US 2023/0320225 A1 Oct. 5, 2023

(30) Foreign Application Priority Data

Mar. 31, 2022 (JP) ................................ 2022-060800

(51) Int. Cl.
*H10N 30/87* (2023.01)
*H10N 30/50* (2023.01)

(52) U.S. Cl.
CPC ......... *H10N 30/871* (2023.02); *H10N 30/508* (2023.02)

(58) Field of Classification Search
CPC .. H10N 30/871; H10N 30/508; H10N 30/874; H10N 30/872
See application file for complete search history.

(56) References Cited

U.S. PATENT DOCUMENTS

| | | | | |
|---|---|---|---|---|
| 9,751,306 | B2 * | 9/2017 | Sato | B41J 2/161 |
| 2018/0013056 | A1 | 1/2018 | Ohta et al. | |

FOREIGN PATENT DOCUMENTS

| | | | |
|---|---|---|---|
| JP | 2006-147941 | A | 6/2006 |
| JP | 6747111 | B2 | 8/2020 |

OTHER PUBLICATIONS

Machine translation of JP 2006-147941A (Year: 2006).*
Jul. 8, 2025 Office Action issued in Japanese Patent Application No. 2022-060800.

* cited by examiner

*Primary Examiner* — Emily P Pham
(74) *Attorney, Agent, or Firm* — Oliff PLC

(57) ABSTRACT

A piezoelectric element includes a piezoelectric body, an external electrode, and an internal electrode. The internal electrode includes first and second internal conductors opposing each other. The first internal conductor includes first and second conductor portions continuous with each other. The second internal conductor includes a third conductor portion opposing the first conductor portion in a direction where the first and second internal conductors oppose each other, and a fourth conductor portion including a first region connected to the second conductor portion, and a second region continuous with the first region and continuous with the third conductor portion. The piezoelectric body includes a body portion located between the first and the second internal conductors, and formed with a through hole penetrating the body portion in the direction. The fourth conductor portion is located in the through hole and has a thickness increasing toward a center line of the through hole.

23 Claims, 12 Drawing Sheets

PD1
D1
D2
D3
1
1a
1b
1c
1d
3a
3b
3c
3d
3e
5a
5b
5c
5d
5e
10
20
30
31
32
33
34
35b
35c
35d
35e
40
41
42
43
44
45b
45c
45d
45e

SP1
D1
D1a
D1b
5d
5c
5b
5a
D3
32
32a
32b
32c
32d
32d1
32d2
51
31a
35b
50
32q
32f
32s
W1
W2
CL1
31
31b
32p
36
36a
36b
36c
33
32r
1
H1
H2
D2

SP1
D1
D1a
D1b
D2
D3
5e
5d
5c
34
34a
34b
34c
34d
34d1
34d2
51
34q
34f
34s
34p
50
W1
W2
CL1
1b
33
33a
33b
35d
34r
36
36a
36b
36c
H1
H2
1

SP1
D1
D1a
D1b
5d
5c
5b
5a
D3
42
42a
42b
42c
42d
42d1
42d2
41a
42q
42r
42s
42f
42p
W1
W2
CL1
50
41
41b
45b
51
46
46a
46b
46c
43
1
H1
H2
D2

SP1
D1
D1a
D1b
5e
5d
5c
D3
44
44a
44b
44c
44d
44d1
44d2
44q
44r
44s
44f
44p
51
43a
43
43b
45d
50
W1
W2
CL1
1b
46
46a
46b
46c
H1
H2
1
D2

PIEZOELECTRIC ELEMENT INCLUDING A PIEZOELECTRIC ELEMENT BODY, AN EXTERNAL ELECTRODE AND AN INTERNAL ELECTRODE

CROSS-REFERENCE TO RELATED APPLICATIONS

This application is based upon and claims the benefit of priority from Japanese Patent Application No. 2022-060800, filed on Mar. 31, 2022. The entire contents of which are incorporated herein by reference.

BACKGROUND

Field

The present disclosure relates to a piezoelectric element.

Description of the Related Art

Known piezoelectric elements include a piezoelectric body, an external electrode disposed on an outer surface of the element body, and an internal electrode connected to the external electrode and disposed in the element body (for example, refer to Japanese Patent No. 6747111).

SUMMARY

An object of an aspect of the present disclosure is to provide a piezoelectric element that improves reliability of electrical connection at an internal electrode.

The present inventors conducted thorough research on the piezoelectric element that improves reliability of electrical connection at an internal electrode. As a result, the present inventors newly obtained the following finding, and have accomplished the present disclosure.

The internal electrode may include a first internal conductor and a second internal conductor opposing each other. In this case, the first internal conductor includes a first conductor portion and a second conductor portion continuous with each other. The second internal conductor includes a third conductor portion and a fourth conductor portion continuous with each other. The third conductor portion opposes the first conductor portion in a direction where the first internal conductor and the second internal conductor oppose each other. The fourth conductor portion is connected to the second conductor portion.

In the piezoelectric element, stress from the piezoelectric body may affect the internal electrode in a case where the piezoelectric body is deformed. Stress affecting the internal electrode from the piezoelectric body tends to be concentrated on a location where a shape of the internal electrode changes. The shape of the internal electrode changes at a location where the fourth conductor portion and the second and third conductor portions are connected or continuous with each other. Stress affecting the internal electrode from the piezoelectric body tends to make a concentration on portions connected or continuous with each other. The concentration of stress may decrease the reliability of the electrical connection at the portions connected or continuous with each other. The internal electrode where the reliability of the electrical connection is decreased tends not to realize stable transmission of a drive signal.

The internal electrode in which the change in shape at the portions connected or continuous with each other is reduced prevents concentration of stress affecting the internal electrode from the piezoelectric body in the portions connected or continuous with each other. Prevention of the concentration of stress on the portions connected or continuous with each other improves reliability of electrical connection in the internal electrode.

A piezoelectric element according to one aspect of the present disclosure includes a piezoelectric body, an external electrode disposed on an outer surface of the piezoelectric body, and an internal electrode connected to the external electrode and disposed in the piezoelectric body. The internal electrode includes a first internal conductor and a second internal conductor opposing each other. The first internal conductor includes a first conductor portion and a second conductor portion continuous with each other. The second internal conductor includes a third conductor portion opposing the first conductor portion in a direction where the first internal conductor and the second internal conductor oppose each other, and a fourth conductor portion including a first region connected to the second conductor portion, and a second region continuous with the first region and continuous with the third conductor portion. The piezoelectric body includes a body portion located between the first internal conductor and the second internal conductor and formed with a through hole penetrating the body portion in the direction, and the fourth conductor portion is located in the through hole and has a thickness increasing toward a center line of the through hole.

In the one aspect, the first internal conductor and the second internal conductor opposing each other are connected to each other with the fourth conductor portion. The fourth conductor portion is continuous with the third conductor portion of the second internal conductor. A thickness of the fourth conductor portion in the direction increases toward a center line of the through hole. Therefore, the shape of the internal electrode gradually changes at a location where the fourth conductor portion and the third conductor portion are continuous with each other. Stress affecting the internal electrode from the piezoelectric body along with deformation of the piezoelectric body tends not to concentrate on the portions connected or continuous with each other. A decrease in reliability of electrical connection due to concentration of stress is prevented at the portions connected or continuous with each other. As a result, the reliability of electrical connection at the internal electrode is improved.

In the one aspect, the first region has a first thickness in the direction, the second region has a second thickness in the direction, and a degree of increase in the second thickness is smaller than a degree of increase in the first thickness.

In the configuration in which the degree of increase in the second thickness is smaller than the degree of increase in the first thickness, the shape of the internal electrode changes more gradually at the continuous portions. Stress affecting the internal electrode from the piezoelectric body along with deformation of the piezoelectric body further tends not to be concentrated on the continuous portions. As a result, the reliability of electrical connection at the internal electrode is further improved.

In the one aspect, the direction may include a first direction from the first internal conductor toward the second internal conductor and a second direction from the second internal conductor toward the first internal conductor. The second region may include a region portion having a thickness in the first direction from a reference plane orthogonal to the direction and including the third conductor portion, and a region portion having a thickness in the second direction from the reference plane. A thickness of each region portion included in the second region in the direction may increase toward the center line.

In the configuration in which the thickness of each region portion included in the second region in the direction increases toward the center line, the shape of the internal electrode changes more gradually at the continuous portions. Stress affecting the internal electrode from the piezoelectric body along with deformation of the piezoelectric body further tends not to concentrate on the portions connected or continuous with each other. As a result, the reliability of electrical connection at the internal electrode is further improved.

In the one aspect, the second conductor portion may include an outer edge, and the entire outer edge may be positioned inside an outer edge of the second region when viewed in the direction.

In the configuration in which the second conductor portion includes an outer edge, and the entire outer edge is positioned inside an outer edge of the second region when viewed in the direction, the outer edge of the second region is positioned farther distant from the center line when viewed in the direction, and a degree of increase in the thickness of the second region in the direction decreases. The shape of the internal electrode changes more gradually at the continuous portions. Stress affecting the internal electrode from the piezoelectric body along with deformation of the piezoelectric body further tends not to concentrate on the portions connected or continuous with each other. As a result, the reliability of electrical connection at the internal electrode is further improved.

In the one aspect, the second region is formed with a recess at an end portion distant from the first region in the direction.

In the configuration in which the second region is formed with a recess at an end portion distant from the first region in the direction, a thickness of the fourth conductor portion in the direction decreases by an amount of the recess formed in the second region. Due to the decrease in thickness, the fourth conductor portion more easily follows contraction and extension of the third conductor portion accompanying deformation of the piezoelectric body. Therefore, a decrease in the reliability of electrical connection at the continuous portions is further prevented. As a result, the reliability of electrical connection at the internal electrode is further improved.

In the one aspect, the recess may have a depth increasing toward the center line.

In the configuration in which the recess may have a depth increasing toward the center line, the thickness of the fourth conductor portion in the direction decreases toward the center line. The fourth conductor portion more easily follows contraction and extension of the third conductor portion due to deformation of the piezoelectric body. Therefore, the decrease in the reliability of electrical connection at the continuous portions is further prevented. As a result, the reliability of electrical connection at the internal electrode is further improved.

In the one aspect, the second conductor portion may include an outer edge, and the outer edge may be positioned inside an outer peripheral edge of the recess when viewed in the direction.

In the configuration in which the second conductor portion includes an outer edge, and the outer edge is positioned inside an outer peripheral edge of the recess when viewed in the direction, the second conductor portion is located inside the outer peripheral edge of the recess when viewed in the direction, a range in which the thickness of the fourth conductor portion in the direction is reduced due to the formation of the recess is further expanded. Through further expanding the range in which the thickness decreases, the fourth conductor portion more easily follows contraction and extension of the third conductor portion due to deformation of the piezoelectric body. Therefore, the decrease in the reliability of electrical connection at the continuous portions is further prevented. As a result, the reliability of electrical connection at the internal electrode is further improved.

In the one aspect, the second region and the recess may have a circular shape when viewed in the direction.

In the configuration in which the second region and the recess have a circular shape when viewed in the direction, the fourth conductor portion more easily follows contraction and extension in a direction intersecting the direction of the third conductor portion due to deformation of the piezoelectric body. Therefore, the decrease in the reliability of electrical connection at the continuous portions is further prevented. As a result, the reliability of electrical connection at the internal electrode is further improved.

In the one aspect, the first region may have a length in the direction smaller than a distance between a bottom of the recess and the second conductor portion in the direction.

In the configuration in which the first region has the length in the direction smaller than the distance between a bottom of the recess and the second conductor portion in the direction, the fourth conductor portion more easily follows contraction and extension of the third conductor portion due to deformation of the piezoelectric body. Therefore, the decrease in the reliability of electrical connection at the continuous portions is further prevented. As a result, the reliability of electrical connection at the internal electrode is further improved.

The present disclosure will become more fully understood from the detailed description given hereinafter and the accompanying drawings which are given by way of illustration only, and thus are not to be considered as limiting the present disclosure.

Further scope of applicability of the present disclosure will become apparent from the detailed description given hereinafter. However, it should be understood that the detailed description and specific examples, while indicating examples of the disclosure, are given by way of illustration only, since various changes and modifications within the spirit and scope of the disclosure will become apparent to those skilled in the art from this detailed description.

DETAILED DESCRIPTION

Figure 1:
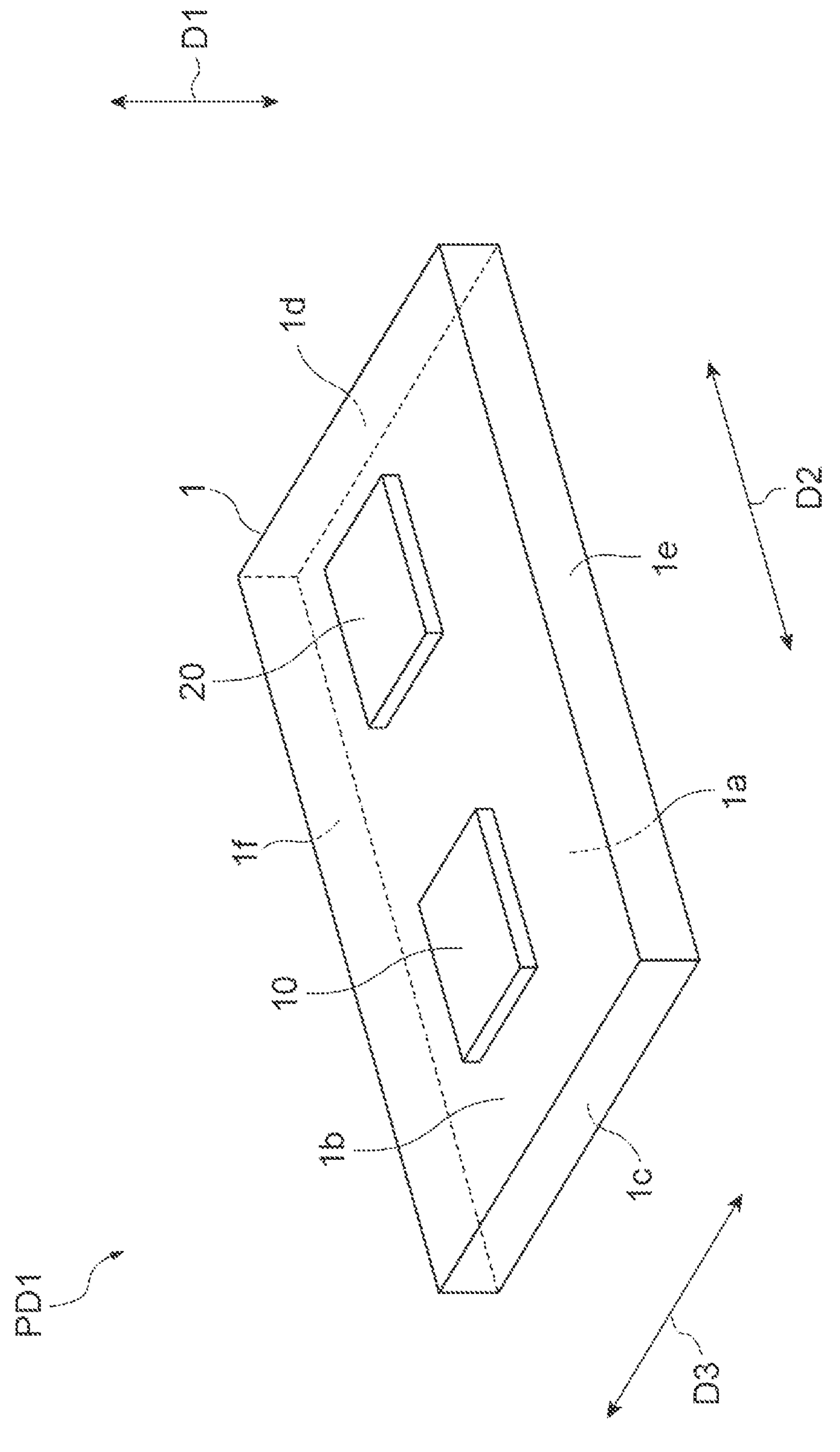
FIG. 1 is a perspective view illustrating a piezoelectric element according to an example.

Hereinafter, examples of the present disclosure will be described in detail with reference to the accompanying drawings. In the following description, the same elements or elements having the same functions are denoted with the same reference numerals and overlapped explanation is omitted.

Figure 2:
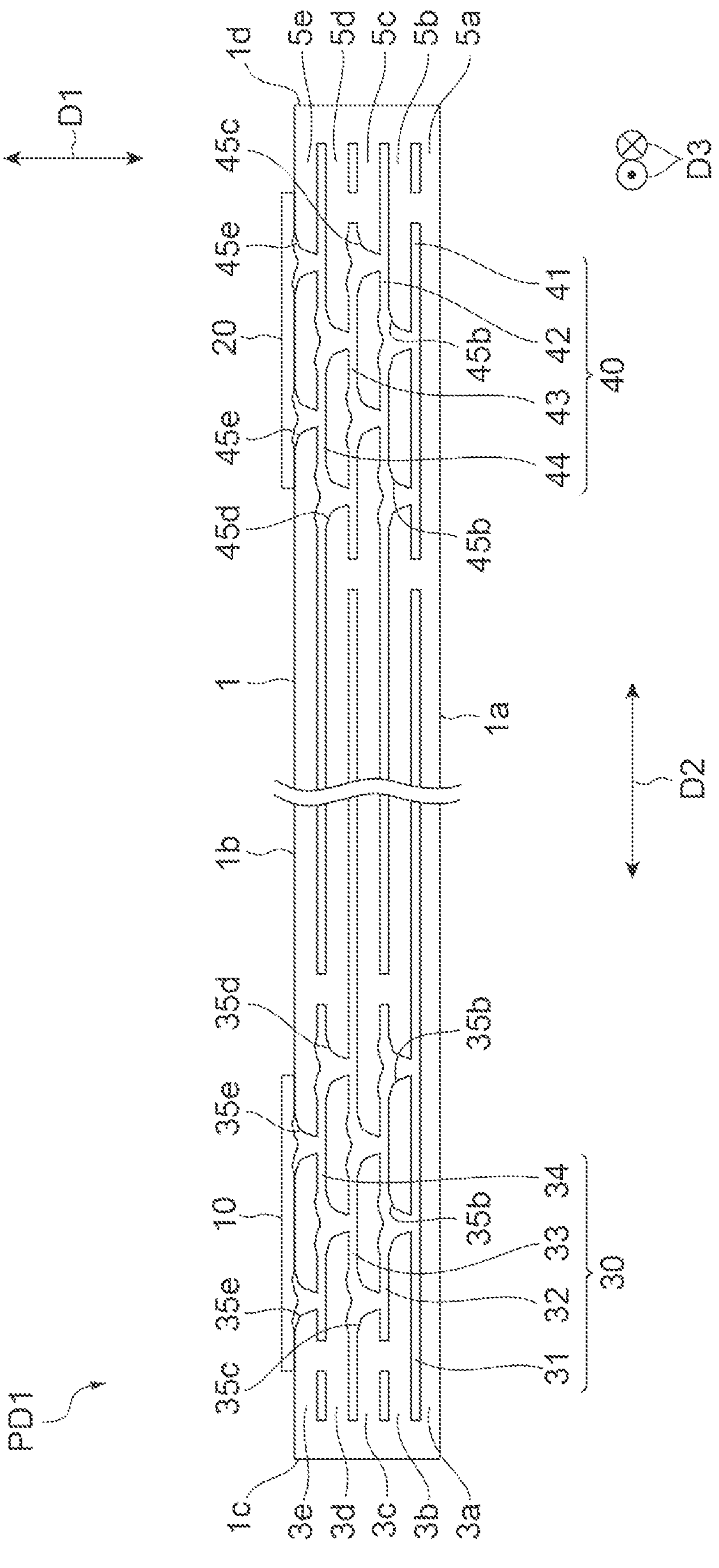
FIG. 2 is a diagram illustrating a cross-sectional configuration of the piezoelectric element according to the present example.
Figure 3:
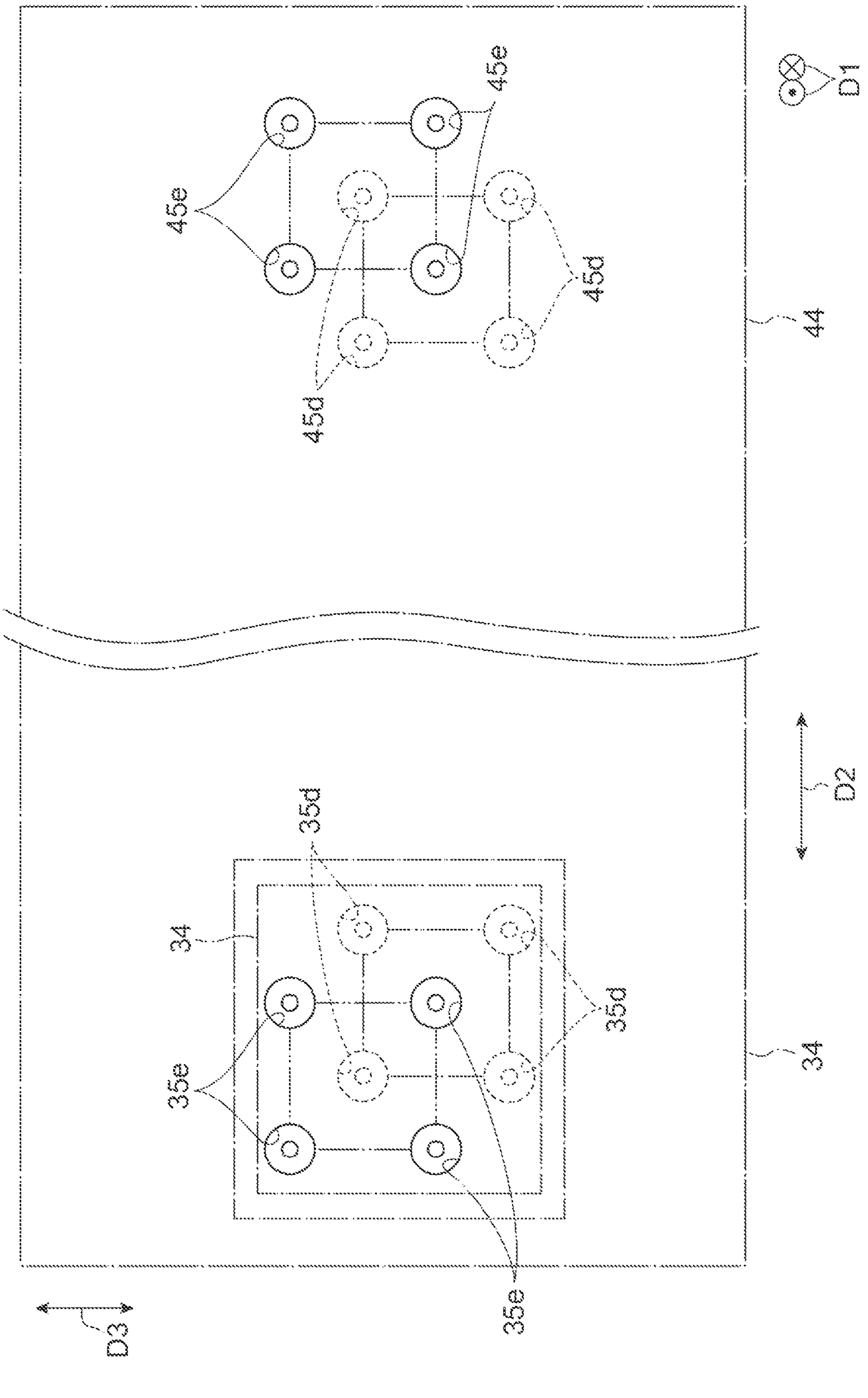
FIG. 3 is a diagram illustrating a disposition of through holes.

A configuration of a piezoelectric element PD1 according to the present example will be described with reference to FIGS. 1 to 12. FIG. 1 is a perspective view illustrating the piezoelectric element according to the present example. FIG. 2 is a diagram illustrating a cross-sectional configuration of the piezoelectric element according to the present example; FIG. 3 is a diagram illustrating a disposition of through holes; FIGS. 4 to 12 are diagrams illustrating a configuration of an internal conductor. In FIGS. 4 to 12, hatching is omitted to clearly illustrate the configuration of the internal conductor.

As illustrated in FIGS. 1 and 2, the piezoelectric element PD1 includes a piezoelectric body 1, external electrodes 10 and 20, and internal electrodes 30 and 40. The external electrodes 10 and 20 are disposed on an outer surface of the piezoelectric body 1. The internal electrodes 30 and 40 are disposed in the piezoelectric body 1. Each of the internal electrodes 30 and 40 is connected to a corresponding external electrode of the external electrodes 10 and 20. The internal electrode 30 is, for example, connected to the external electrode 10. The internal electrode 40 is, for example, connected to the external electrode 20. The internal electrodes 30 and 40 are physically and electrically connected to the corresponding external electrodes 10 and 20. For example, voltages having different polarities are applied to the external electrodes 10 and 20.

In the present example, the piezoelectric body 1 include a piezoelectric body 1 having a rectangular parallelepiped shape. The piezoelectric body 1 includes a pair of main surfaces 1*a* and 1*b* opposing each other, a pair of side surfaces 1*c* and 1*d* opposing each other, and a pair of side surfaces 1*e* and 1*f* opposing each other. The outer surface of the piezoelectric body 1 includes the main surfaces 1*a* and 1*b*, the side surfaces 1*c* and 1*d*, and the side surfaces 1*e* and 1*f*. The main surfaces 1*a* and 1*b*, the side surfaces 1*c* and 1*d*, and the side surfaces 1*e* and 1*f* have rectangular shapes.

The main surfaces 1*a* and 1*b* oppose each other in a first direction D1. The main surfaces 1*a* and 1*b* include both ends of the piezoelectric body 1 in the first direction D1. The side surfaces 1*c* and 1*d* are adjacent to the main surfaces 1*a* and 1*b* and oppose each other in a second direction D2 intersecting the first direction D1. The side surfaces 1*c* and 1*d* include both ends of the piezoelectric body 1 in the second direction D2. The side surfaces 1*e* and 1*f* are adjacent to the main surfaces 1*a* and 1*b* and the side surfaces 1*c* and 1*d*, and oppose each other in a third direction D3. The third direction D3 intersects with the first direction D1 and the second direction D2. The side surfaces 1*e* and 1*f* include both ends of the piezoelectric body 1 in the third direction D3. In the present example, the first direction D1, the second direction D2, and the third direction D3 are orthogonal to each other. The "rectangular parallelepiped shape" in the present specification includes a rectangular parallelepiped shape in which corner portions and ridge portions are chamfered, or a rectangular parallelepiped shape in which corner portions and ridge portions are rounded. The "rectangular shape" in the present specification includes, for example, a shape in which each corner is chamfered or a shape in which each corner is rounded.

The main surfaces 1*a* and 1*b* extend in the second direction D2 to couple the side surface 1*c* and the side surface 1*d*. The main surfaces 1*a* and 1*b* extend in the third direction D3 to couple the side surface 1*e* and the side surface 1*f*. The side surfaces 1*c* and 1*d* extend in the first direction D1 to couple the main surface 1*a* and the main surface 1*b*. The side surfaces 1*c* and 1*d* extend in the third direction D3 to couple the side surface 1*e* and the side surface 1*f*. The side surfaces 1*e* and 1*f* extend in the first direction D1 to couple the main surface 1*a* and the main surface 1*b*. The side surfaces 1*e* and 1*f* extend in the second direction D2 to couple the side surface 1*c* and the side surface 1*d*. The main surfaces 1*a* and 1*b*, the side surfaces 1*c* and 1*d*, and the side surfaces 1*e* and 1*f* may be indirectly adjacent to each other. In this case, ridge portions are positioned between the main surfaces 1*a* and the side surfaces 1*c*, 1*d*, 1*e*, and 1*f*. Ridge portions are positioned between the main surfaces 1*b* and the side surfaces 1*c*, 1*d*, 1*e*, and 1*f*. Ridge portion are positioned between the side surface 1*c* and the side surfaces 1*e* and 1*f*. Ridge portion are positioned between the side surface 1*d* and the side surfaces 1*e* and 1*f*.

A length of the piezoelectric body 1 in the first direction D1, that is, a thickness of the piezoelectric body 1 is, for example, 0.2 mm to 0.5 mm A length of the piezoelectric body 1 in the second direction D2 is, for example, 20 mm A length of the piezoelectric body 1 in the third direction D3 is, for example, 10 mm. In the piezoelectric body 1, for example, the second direction D2 is a long side direction.

The piezoelectric body 1 includes, for example, a plurality of piezoelectric layers 3*a*, 3*b*, 3*c*, 3*d*, and 3*e*. In the present example, the piezoelectric body 1 includes five piezoelectric layers 3*a*, 3*b*, 3*c*, 3*d*, and 3*e*. The piezoelectric layers 3*a*, 3*b*, 3*c*, 3*d*, and 3*e* are laminated in the first direction D1, for example. The piezoelectric layer 3*a* includes the main surface 1*a*. The piezoelectric layer 3*e* includes the main surface 1*b*. The piezoelectric layers 3*b*, 3*c*, and 3*d* are located between the piezoelectric layer 3*a* and the piezoelectric layer 3*e*. In the present example, thicknesses of the piezoelectric layers 3*a*, 3*b*, 3*c*, 3*d*, and 3*e* are equal to each other. "Equal" in the present specification does not necessarily mean only that the values coincide. Even in a case where a slight difference, a making error, or a measurement error within a preset range is included, the thicknesses may be equal. In the present example, the piezoelectric element PD1 is a so-called multilayer piezoelectric element.

The piezoelectric layers 3*a*, 3*b*, 3*c*, 3*d*, and 3*e* include a piezoelectric material. In the present example, the piezoelectric layers 3*a*, 3*b*, 3*c*, 3*d*, and 3*e* include a piezoelectric ceramic material. The piezoelectric ceramic material includes, for example, PZT [$Pb(Zr,Ti)O_3$], PT($PbTiO_3$), or barium titanate ($BaTiO_3$). The piezoelectric layers 3*a*, 3*b*, 3*c*, 3*d*, and 3*e* are composed of, for example, a sintered body of a ceramic green sheet including the piezoelectric ceramic material. In the actual piezoelectric body 1, the piezoelectric layers 3*a*, 3*b*, 3*c*, 3*d*, and 3*e* are integrated to such an extent that boundaries between the piezoelectric layers 3*a*, 3*b*, 3*c*, 3*d*, and 3*e* cannot be visually recognized.

The external electrode 10 is disposed on the main surface 1*b*, for example. The external electrode 10 is, for example, separated from all edges (four sides) of the main surface 1*b* when viewed in the first direction D1. The external electrode 20 is disposed on the main surface 1*b*, for example. The external electrode 20 is, for example, separated from all edges (four sides) of the main surface 1*b* when viewed in the first direction D1. In the present example, the external electrodes 10 and 20 have a rectangular shape when viewed in the first direction D1. The external electrodes 10 and 20 have, for example, the same shape when viewed in the first direction D1. When viewed in the first direction D1, a long side direction of the external electrodes 10 and 20 coincides with, for example, the second direction D2. A short side direction of the external electrodes 10 and 20 coincides with the third direction D3. The external electrodes 10 and 20 include a conductive material. The conductive material included in the external electrodes 10 and 20 includes, for example, Ag, Pd, Cu, Pt, an Au—Pd alloy, or an Ag—Pd alloy. The external electrodes 10 and 20 are composed of, for example, a sintered body of a conductive paste including the conductive material.

The internal electrode 30 includes, for example, an internal conductor 31, an internal conductor 32, an internal conductor 33, and an internal conductor 34. Each of the internal conductors 31, 32, 33, and 34 has electrical conductivity. The internal conductor 31, the internal conductor 32, the internal conductor 33, and the internal conductor 34 are disposed at different positions (layers) in the first direction D1. The internal conductor 31, the internal conductor 32, the internal conductor 33, and the internal conductor 34 oppose each other with an interval in the first direction D1. The internal conductor 31, the internal conductor 32, the internal conductor 33, and the internal conductor 34 are disposed in the order of the internal conductor 31, the internal conductor 32, the internal conductor 33, and the internal conductor 34 in the first direction D1, for example. The internal conductor 34 opposes the external electrode 10 in the first direction D1. The internal conductor 31, the internal conductor 32, the internal conductor 33, and the internal conductor 34 are not exposed to the outer surface of the piezoelectric body 1. Therefore, the internal conductor 31, the internal conductor 32, the internal conductor 33, and the internal conductor 34 are separated from all the edges (four sides) of the main surfaces 1*a* and 1*b*. The internal conductor 31, the internal conductor 32, the internal conductor 33, and the internal conductor 34 are separated from the side surfaces 1*c*, 1*d*, 1*e*, and 1*f*. For example, when the internal conductor 31 includes a first internal conductor, the internal conductor 32 includes a second internal conductor. Each of the first and second internal conductors has electrical conductivity. For example, when the internal conductor 32 includes a first internal conductor, the internal conductor 33 includes a second internal conductor. For example, when the internal conductor 33 includes a first internal conductor, the internal conductor 34 includes a second internal conductor.

The piezoelectric body 1 includes, for example, a plurality of body portions 5*a*, 5*b*, 5*c*, 5*d*, and 5*e*. The body portion 5*a* is located between the main surface 1*a* and the internal conductor 31. The body portion 5*a* includes, for example, the piezoelectric layer 3*a*. The body portion 5*b* is located between the internal conductor 31 and the internal conductor 32. The body portion 5*b* includes, for example, the piezoelectric layer 3*b*. The body portion 5*c* is located between the internal conductor 32 and the internal conductor 33. The body portion 5*c* includes, for example, the piezoelectric layer 3*c*. The body portion 5*d* is located between the internal conductor 33 and the internal conductor 34. The body portion 5*d* includes, for example, the piezoelectric layer 3*d*. The body portion 5*e* is located between the internal conductor 34 and the main surface 1*b*. The body portion 5*e* includes, for example, the piezoelectric layer 3*e*. The internal conductor 31 is located between the body portion 5*a* and the body portion 5*b*. The internal conductor 32 is located between the body portion 5*b* and the body portion 5*c*. The internal conductor 33 is located between the body portion 5*c* and the body portion 5*d*. The internal conductor 34 is located between the body portion 5*d* and the body portion 5*e*.

In the present example, through holes 35*b*, 35*c*, 35*d*, and 35*e* are formed. The through hole 35*b* is formed in the body portion 5*b*. The through hole 35*b* penetrates the body portion 5*b* in the first direction D1. The through hole 35*c* is formed in the body portion 5*c*. The through hole 35*c* penetrates the body portion 5*c* in the first direction D1. The through hole 35*d* is formed in the body portion 5*d*. The through hole 35*d* penetrates the body portion 5*d* in the first direction D1. The through hole 35*e* is formed in the body portion 5*e*. The through hole 35*e* penetrates the body portion 5*e* in the first direction D1.

As illustrated in FIG. 3, the through holes 35*b*, 35*c*, 35*d*, and 35*e* are disposed, for example, in a matrix when viewed in the first direction D1. In the example illustrated in FIG. 3, the through holes 35*b*, 35*c*, 35*d*, and 35*e* are disposed in a matrix of 2 rows and 2 columns when viewed in the first direction D1. The through holes 35*b* and 35*d* overlap each other, for example, when viewed in the first direction D1. The through holes 35*c* and 35*e* overlap each other, for example, when viewed in the first direction D1. The through holes 35*b* and 35*d* and the through holes 35*c* and 35*e* are disposed, for example, at equal intervals when viewed in the first direction D1. The through holes 35*b* and 35*d* and the through holes 35*c* and 35*e* are disposed, for example, at intersections of lattices drawn at equal intervals, that is, square lattices. A disposition interval of the through holes 35*b* and 35*d* in the second direction D2 is, for example, equal to a disposition interval of the through holes 35*c* and 35*e* in the second direction D2. A disposition interval of the through holes 35*b* and 35*d* in the third direction D3 is, for example, equal to a disposition interval of the through holes 35*c* and 35*e* in the third direction D3. The through holes 35*c* and 35*e* are disposed to be moved in parallel with the through holes 35*b* and 35*d* by, for example, ½ of the disposition interval of the through holes 35*b*, 35*c*, 35*d*, and 35*e* in the second direction D2 and the third direction D3 when viewed in the first direction D1. The through holes 35*c* and 35*e* may be disposed to be moved in parallel with the through holes 35*b* and 35*d* by ½ of the disposition interval of the through holes 35*b*, 35*c*, 35*d*, and 35*e* only in one of the second direction D2 and the third direction D3 when viewed in the first direction D1. The through holes 35*b*, 35*c*, 35*d*, and 35*e* may be disposed, for example, in a matrix of 3 rows and 3 columns when viewed in the first direction D1.

The internal electrode 40 includes, for example, an internal conductor 41, an internal conductor 42, an internal conductor 43, and an internal conductor 44. The internal conductor 41, the internal conductor 42, the internal conductor 43, and the internal conductor 44 are disposed at different positions (layers) in the first direction D1. The internal conductor 41, the internal conductor 42, the internal conductor 43, and the internal conductor 44 oppose each other with an interval in the first direction D1. The internal conductor 41, the internal conductor 42, the internal conductor 43, and the internal conductor 44 are disposed in the order of the internal conductor 41, the internal conductor 42, the internal conductor 43, and the internal conductor 44 in the first direction D1, for example. The internal conductor 44 opposes the external electrode 20 in the first direction D1. The internal conductor 41, the internal conductor 42, the internal conductor 43, and the internal conductor 44 are not exposed to the outer surface of the piezoelectric body 1. Therefore, the internal conductor 41, the internal conductor 42, the internal conductor 43, and the internal conductor 44 are separated from all the edges (four sides) of the main surfaces 1*a* and 1*b*. The internal conductor 41, the internal conductor 42, the internal conductor 43, and the internal conductor 44 are separated from the side surfaces 1*c*, 1*d*, 1*e*, and 1*f*. For example, when the internal conductor 41 includes a first internal conductor, the internal conductor 42 includes a second internal conductor. For example, when the internal conductor 42 includes a first internal conductor, the internal conductor 43 includes a second internal conductor. For example, when the internal conductor 43 includes a first internal conductor, the internal conductor 44 includes a second internal conductor.

The body portion 5*a* is located between the main surface 1*a* and the internal conductor 41. The body portion 5*a* includes, for example, the piezoelectric layer 3*a*. The body portion 5*b* is located between the internal conductor 41 and the internal conductor 42. The body portion 5*b* includes, for example, the piezoelectric layer 3*b*. The body portion 5*c* is located between the internal conductor 42 and the internal conductor 43. The body portion 5*c* includes, for example, the piezoelectric layer 3*c*. The body portion 5*d* is located between the internal conductor 43 and the internal conductor 44. The body portion 5*d* includes, for example, the piezoelectric layer 3*d*. The body portion 5*e* is located between the internal conductor 44 and the main surface 1*b*. The body portion 5*e* includes, for example, the piezoelectric layer 3*e*. The internal conductor 41 is located between the body portion 5*a* and the body portion 5*b*. The internal conductor 42 is located between the body portion 5*b* and the body portion 5*c*. The internal conductor 43 is located between the body portion 5*c* and the body portion 5*d*. The internal conductor 44 is located between the body portion 5*d* and the body portion 5*e*.

In the present example, through holes 45*b*, 45*c*, 45*d*, and 45*e* are formed. The through hole 45*b* is formed in the body portion 5*b*. The through hole 45*b* penetrates the body portion 5*b* in the first direction D1. The through hole 45*c* is formed in the body portion 5*c*. The through hole 45*c* penetrates the body portion 5*c* in the first direction D1. The through hole 45*d* is formed in the body portion 5*d*. The through hole 45*d* penetrates the body portion 5*d* in the first direction D1. The through hole 45*e* is formed in the body portion 5*e*. The through hole 45*e* penetrates the body portion 5*e* in the first direction D1.

The through holes 45*b* to 45*e* are disposed, for example, in a matrix when viewed in the first direction D1. For example, when viewed in the first direction D1, four through holes 45*b* to 45*e* are disposed in a matrix of 2 rows and 2 columns. The through holes 45*b* and 45*d* and the through holes 45*c* and 45*e* are disposed, for example, at equal intervals when viewed in the first direction D1. The through holes 45*b* and 45*d* and the through holes 45*c* and 45*e* are disposed, for example, at intersections of lattices drawn at equal intervals, that is, square lattices. A disposition of the through holes 45*b* to 45*e* is, for example, the same as the disposition of the through holes 35*b* to 35*e* exemplified in FIG. 3.

In the example illustrated in FIG. 2, the internal conductor 31 and the internal conductor 42 oppose each other in the first direction D1. The body portion 5*b* is disposed between the internal conductor 31 and the internal conductor 42. The internal conductor 42 and the internal conductor 33 oppose each other in the first direction D1. The body portion 5*c* is disposed between the internal conductor 42 and the internal conductor 33. The internal conductor 33 and the internal conductor 44 oppose each other in the first direction D1. The body portion 5*d* is disposed between the internal conductor 33 and the internal conductor 44.

In the piezoelectric body 1, a region of the body portion 5*b* between the internal conductor 31 and the internal conductor 42, a region of the body portion 5*c* between the internal conductor 42 and the internal conductor 33, and a region of the body portion 5*d* between the internal conductor 33 and the internal conductor 44 constitute a piezoelectrically active region. The active regions are formed between the internal conductor 31 and the internal conductor 42, between the internal conductor 42 and the internal conductor 33, and between the internal conductor 33 and the internal conductor 44. When viewed in the first direction D1, in the body portions 5*b*, 5*c*, and 5*d*, an outer edge of a region where the internal conductor 31 and the internal conductor 42, the internal conductor 42 and the internal conductor 33, and the internal conductor 33 and the internal conductor 44 overlap each other defines a boundary between the active region and an inactive region which is piezoelectrically inactive. In the piezoelectric body 1, the body portion 5*a* and the body portion 5*e* constitute the inactive region.

The internal electrodes 30 and 40 include, for example, an Ag—Pd alloy. The internal electrodes 30 and 40 are formed through, for example, simultaneous sintering with the piezoelectric body 1, and are composed of a sintered body of a conductive paste including particles including Ag and Pd. The internal electrodes 30 and 40 include, for example, Pt, Ag, Pd, Au, Cu, or a conductive material including an alloy thereof other than an Ag—Pd alloy. The internal electrodes 30 and 40 may be composed of a sintered body of a conductive paste including these conductive materials.

Figure 4:
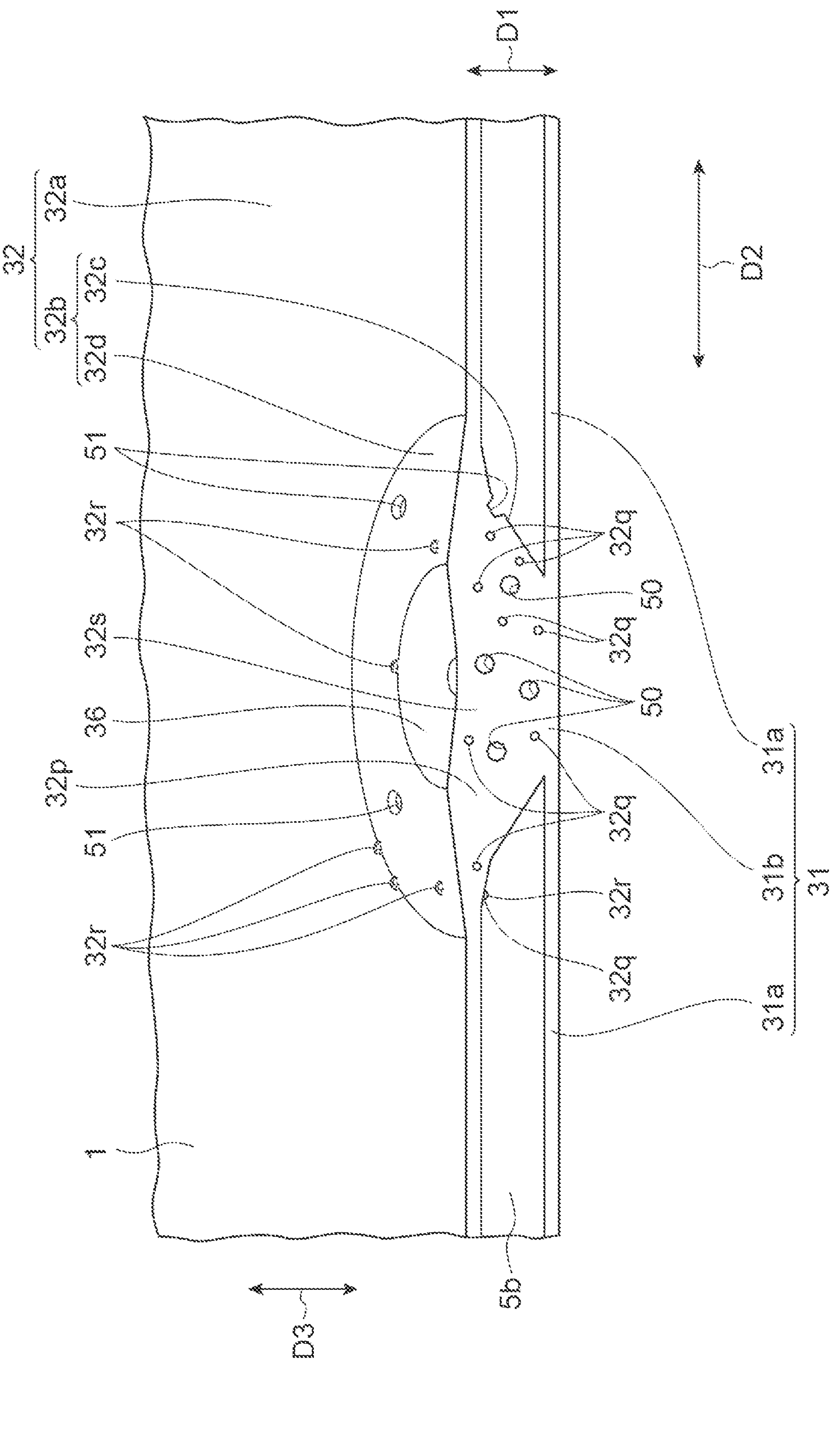
FIG. 4 is a diagram illustrating a configuration of an internal conductor.
Figure 5:
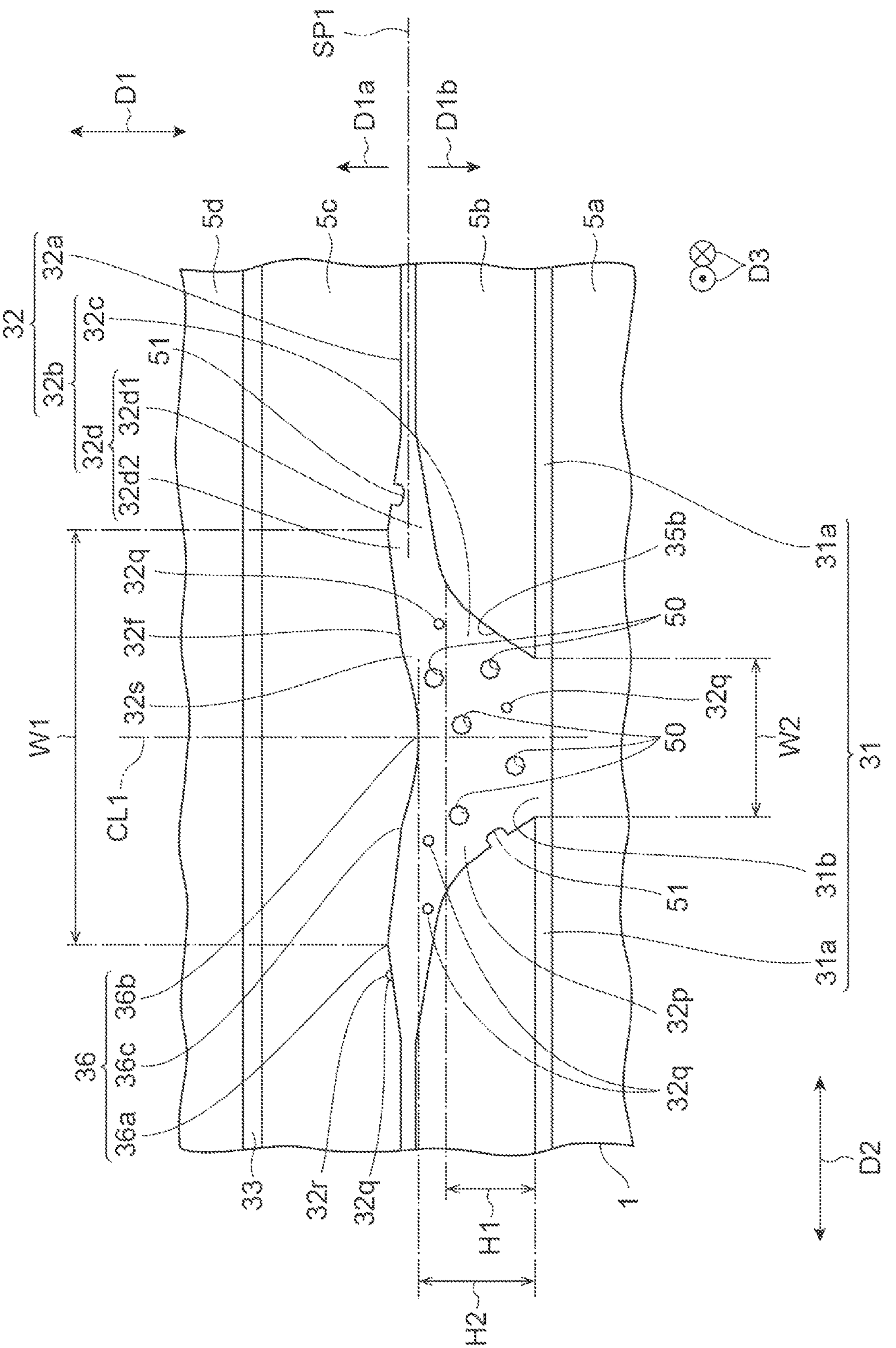
FIG. 5 is a diagram illustrating a configuration of the internal conductor.

FIGS. 4 and 5 are diagrams illustrating configurations of the internal conductors 31 and 32. As illustrated in FIGS. 4 and 5, the internal conductor 31 includes a conductor portion 31*a* and a conductor portion 31*b*. The conductor portion 31*a* and the conductor portion 31*b* are continuous with each other. The conductor portion 31*a* and the conductor portion 31*b* are continuous with each other in the second direction D2 and the third direction D3, for example. For example, when the conductor portion 31*a* includes a first conductor portion, the conductor portion 31*b* includes a second conductor portion.

The internal conductor 32 includes a conductor portion 32*a* and a conductor portion 32*b*. The conductor portion 32*a* opposes the conductor portion 31*a* in the first direction D1. The conductor portion 32*b* extends in the first direction D1 and is connected to the internal conductor 31. The conductor portion 32*b* includes a region 32*c* and a region 32*d*. The region 32*c* is connected to the conductor portion 31*b*. The region 32*c* is physically and electrically connected to the conductor portion 31*b*, for example. The region 32*d* is continuous with the region 32*c* and is continuous with the conductor portion 32*a*. In the present example, the region 32*d* is continuous with the region 32*c* in the first direction D1, and is continuous with the conductor portion 32*a* in the second direction D2 and the third direction D3. The conductor portion 32*b* is located in the through hole 35*b*. For example, when the conductor portion 32*a* includes a third conductor portion, the conductor portion 32*b* includes a fourth conductor portion. For example, when the conductor portion 32*a* includes the third conductor portion, the conductor portion 32*b* includes a connection portion. For example, when the region 32*c* includes a first region, the region 32*d* includes a second region. A thicknesses of the conductor portion 31*a* and the conductor portion 32*a* are, for example, 2 μm.

As illustrated in FIG. 5, the conductor portion 32*b* has a thickness increasing toward a center line CL1 of the through hole 35*b* in the first direction D1. Therefore, in the region 32*c* and the region 32*d*, the thickness in the first direction D1 increases toward the center line CL1. The region 32*c* and the region 32*d* have the total thickness of in the first direction D1 increasing toward the center line CL1 in a direction from the conductor portion 32*a* toward the conductor portion 31*a*. For example, the center line CL1 extends in the first direction D1.

In the present example, the region 32*c* has a thickness in the first direction D1, and the region 32*d* has a thickness in the first direction D1. A degree of increase in the thickness of the region 32*d* in the first direction D1 is different from a degree of increase in the thickness of the region 32*c* in the first direction D1. For example, the degree of increase in the thickness of the region 32*d* in the first direction D1 is smaller than the degree of increase in the thickness of the region 32*c* in the first direction D1. Therefore, the degree of increase in the thickness of the conductor portion 32*b* in the first direction D1 decreases, for example, at a boundary between the region 32*d* and the region 32*c*. The degree of increase in the thickness of the region 32*d* in the first direction D1 may be larger than the degree of increase in the thickness of the region 32*c* in the first direction D1. The degree of increase in the thickness of the region 32*d* in the first direction D1 may be substantially the same as the degree of increase in the thickness of the region 32*c* in the first direction D1. For example, when the thickness of the region 32*c* in the first direction D1 includes a first thickness, the thickness of the region 32*d* in the first direction D1 includes a second thickness.

In the present example, the first direction D1 includes a direction D1*a* from the internal conductor 31 toward the internal conductor 32 and a direction D1*b* from the internal conductor 32 toward the internal conductor 31. The region 32*d* includes a region portion 32*d*1 and a region portion 32*d*2. The region portion 32*d*1 has a thickness in the direction D1*b* from a reference plane SP1. The region portion 32*d*2 has a thickness in the direction D1*a* from the reference plane SP1. The reference plane SP1 is a plane orthogonal to the first direction D1 and including the conductor portion 32*a*. A thickness of each of the region portions 32*d*1 and 32*d*2 in the first direction D1 increases toward the center line CL1. For example, when the direction D1*a* includes a first direction, the direction D1*b* includes a second direction.

When viewed in the first direction D1, the region 32*d* has, for example, a circular shape. When viewed in the first direction D1, the region 32*c* and the conductor portion 31*b* have, for example, a circular shape. The region 32*d* extends to the outside of the conductor portion 31*b* over the entire circumference of the conductor portion 31*b* when viewed in the first direction D1. Therefore, for example, when viewed in the first direction D1, the circular shape of the region 32*d* includes the circular shape of the conductor portion 31*b* and extends to the outer side of the circular shape of the conductor portion 31*b*. The "circular shape" in the present specification includes, for example, a perfect circular shape or an elliptical shape.

The second region 32*d* is formed with a recess 36 at an end portion 32*f* distant from the region 32*c* in the first direction D1. The recess 36 has, for example, a circular shape when viewed in the first direction D1. The recess 36 is filled with, for example, the body portion 5*c*. The recess 36 is open in a direction from the conductor portion 31*a* toward the conductor portion 32*a*. The recess 36 includes, for example, an opening edge 36*a*, a bottom 36*b*, and an inclined portion 36*c*. The inclined portion 36*c* couples the opening edge 36*a* and the bottom 36*b*. A depth of the recess 36 increases from the opening edge 36*a* toward the bottom 36*b*. The opening edge 36*a* defines an outer peripheral edge of the recess 36 when viewed in the first direction D1. When viewed in the first direction D1, the conductor portion 31*b* is located inside the outer peripheral edge of the recess 36. The bottom 36*b* has, for example, a circular shape when viewed in the first direction D1. A width of the bottom 36*b* is smaller than a width of the opening edge 36*a*, that is, an opening width W1. The inclined portion 36*c* is formed such that the width of the bottom 36*b* is smaller than the opening width W1, for example. The bottom 36*b* intersects with the center line CL1, for example. A central axis of the recess 36 substantially coincides with the center line CL1, for example. The recess 36 has a depth increasing toward the center line CL1.

In the present example, the conductor portion 31*b* includes an outer edge, and the entire outer edge is positioned inside an outer edge of the region 32*d* when viewed in the first direction D1. Therefore, the opening width W1 is larger than a width W2 of the conductor portion 31*b*, for example. Therefore, the recess 36 extends to the outside of the conductor portion 31*b* over the entire circumference of the conductor portion 31*b* when viewed in the first direction D1. The opening width W1 may be smaller than the width W2 of the conductor portion 31*b*, and may be substantially the same as the width W2 of the conductor portion 31*b*.

A length H1 of the region 32*c* in the first direction D1 is, for example, smaller than a distance H2 between the bottom 36*b* and the conductor portion 31*b* in the first direction D1. The distance H2 is a distance from the bottom 36*b* to the conductor portion 31*b* in the first direction D1. Therefore, a position where the degree of increase in the thickness of the conductor portion 32*b* changes is closer to the conductor portion 31*b* than the bottom 36*b* in the first direction D1. The length H1 may be greater than the distance H2 and may be substantially the same as the distance H2. Since the recess 36 is formed, the thickness of the conductor portion 32*b* in the first direction D1 decreases.

As illustrated in FIGS. 4 and 5, the conductor portion 32*b* includes a region 32*p* and a region 32*q*. The region 32*p* includes a first material having electrical conductivity. The region 32*q* includes a second material different from the first material. The first material has a first linear expansion coefficient. The second material has a second linear expansion coefficient different from the first linear expansion coefficient. For example, the second material has the second linear expansion coefficient smaller than the first linear expansion coefficient. In the present specification, the "linear expansion coefficient" represents a rate at which a length of the material changes due to a temperature change. The "linear expansion coefficient" is defined by, for example, a rate of change in length per 1° C. of temperature change.

The first material includes, for example, the same conductive material as the material included in the internal electrode 30 other than the conductor portion 32*b*. In the present example, the first material includes, for example, an Ag—Pd alloy, or a conductive material including Pt, Ag, Pd, Au, Cu, or an alloy thereof. The conductor portion 32*b* may be composed of a sintered body of a conductive paste including these conductive materials.

The second material includes, for example, a ceramic material. The ceramic material included in the second material is, for example, the same as the ceramic material included in the piezoelectric body 1. The ceramic material included in the second material includes, for example, copper oxide.

The conductor portion 32*b* includes, for example, a plurality of the regions 32*q*. The plurality of regions 32*q* are distributed in the region 32*p*. The plurality of regions 32*q* are uniformly distributed in the region 32*p*, for example. In this case, the region 32*p* does not include a region in which the plurality of regions 32*q* are unevenly distributed as compared with other regions.

Each of the regions 32*q* includes, for example, a protruding portion 32*r*. The portion 32*r* protrudes toward the piezoelectric body 1. Therefore, the region 32*q* is in contact with the piezoelectric body 1, for example. The region 32*q* may be integrated with the piezoelectric body 1, for example.

The region 32*q* is positioned in at least one of the regions 32*c* and 32*d*. Therefore, the region 32*q* is positioned in both the region 32*c* and the region 32*d*, for example. For example, the region 32*q* is positioned in the region 32*c* and is not positioned in the region 32*d*. For example, the region 32*q* is positioned in the region 32*d* and is not positioned in the region 32*c*.

The region 32*q* is positioned, for example, in a region 32*s* including a surface defining the recess 36 in the region 32*d*. In the present example, the region 32*q* is positioned in, for example, the region 32*c*, the region 32*d*, and the region 32*s*. For example, the region 32*q* is positioned in the region 32*c* and the region 32*s*, and is not positioned in the region 32*d*. For example, the region 32*q* is positioned in the region 32*d* and the region 32*s*, and is not positioned in the region 32*c*. The region 32*q* may not be positioned in the region 32*s*. In the regions 32*c*, 32*d*, and 32*s*, when the region 32*q* is positioned, for example, the portion 32*r* may protrude toward the piezoelectric body 1.

As illustrated in FIGS. 4 and 5, a cavity 50 is formed in the conductor portion 32*b*. In the present example, one or a plurality of the cavities 50 are formed. FIGS. 4 and 5 illustrate an example in which the plurality of cavities 50 are formed. Each of the cavities 50 includes, for example, an inert gas. The inert gas included in the cavity 50 is, for example, $N_2$ or $CO_2$. The concentration of the inert gas is, for example, dilute. The cross section of the cavity 50 has a polygonal shape.

The plurality of cavities 50 are formed to be distributed in the conductor portion 32*b*. The plurality of cavities 50 are formed to be uniformly distributed in the conductor portion 32*b*, for example. In this case, the conductor portion 32*b* does not include a region in which the plurality of cavities 50 are unevenly distributed as compared with other regions.

The cavity 50 is formed in at least one of the region 32*c* and the region 32*d*. Therefore, the cavity 50 is formed in both the region 32*c* and the region 32*d*, for example. The cavity 50 is formed in the region 32*c*, for example, and is not formed in the region 32*d*. The cavity 50 is formed in the region 32*d*, for example, and is not formed in the region 32*c*.

The cavity 50 is formed, for example, in a region 32*s* including a surface defining the recess 36 in the region 32*c*. In the present example, the cavity 50 is formed in, for example, the region 32*c*, the region 32*d*, and the region 32*s*. The cavity 50 is formed in the region 32*c* and the region 32*s*, for example, and is not formed in the region 32*d*. The cavity 50 is positioned, for example, in the region 32*d* and the region 32*s*, and is not formed in the region 32*c*. The cavity 50 may not be formed in the region 32*s*.

In the conductor portion 32*b*, a recess 51 opened at the outer peripheral surface of the conductor portion 32*b* is formed. In the present example, for example, a plurality of the recesses 51 are formed. Each of the recesses 51 is filled with the piezoelectric body 1. In the example illustrated in FIGS. 4 and 5, the body portions 5*b* and 5*c* are filled in each of the recesses 51.

Figure 6:
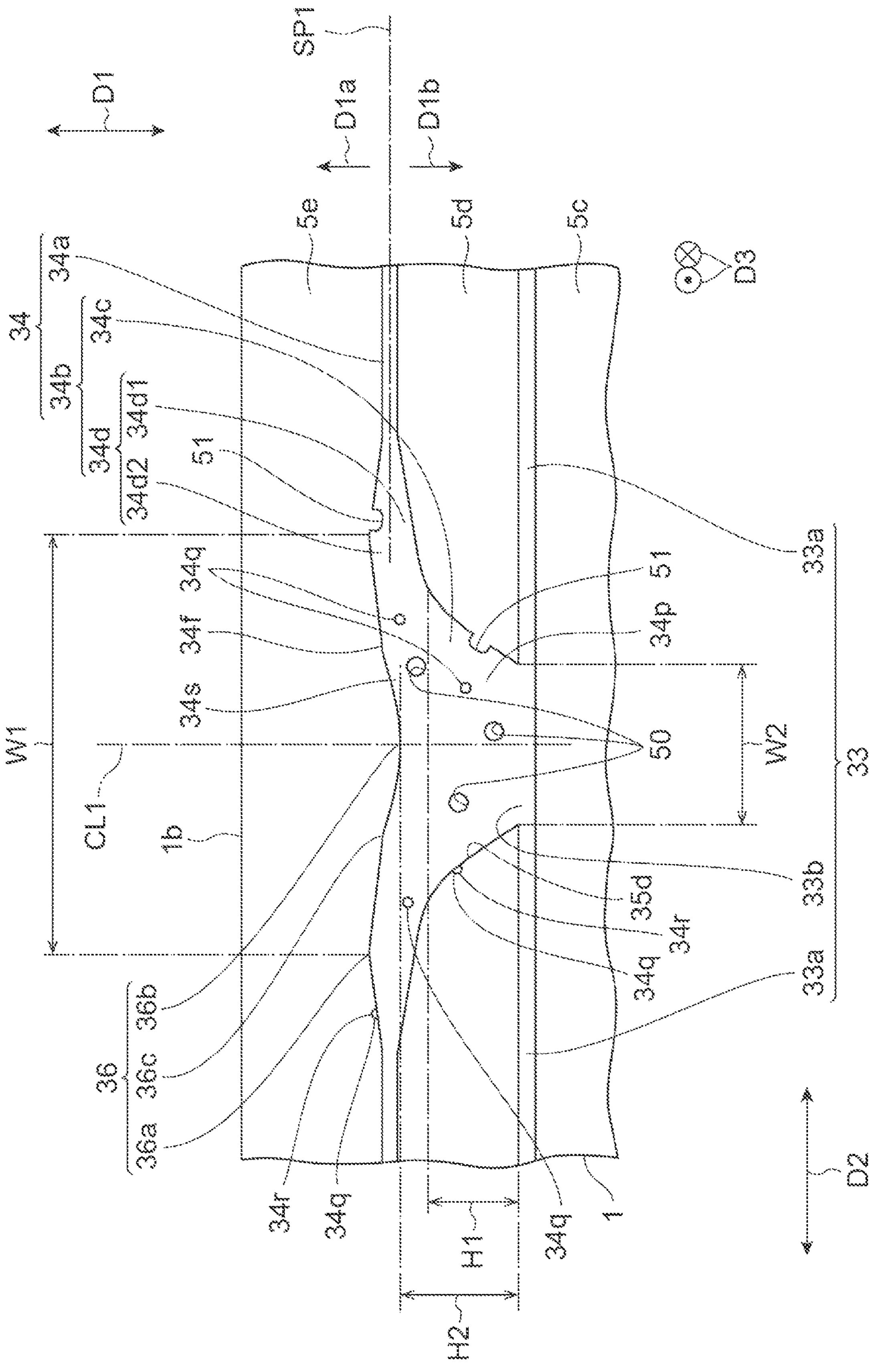
FIG. 6 is a diagram illustrating a configuration of the internal conductor.

FIG. 6 is a diagram illustrating a configuration of the internal conductors 33 and 34. As illustrated in FIG. 6, the internal conductor 33 includes a conductor portion 33*a* and a conductor portion 33*b*. The conductor portion 33*a* and the conductor portion 33*b* are continuous with each other. The conductor portion 33*a* and the conductor portion 33*b* are continuous with each other in the second direction D2 and the third direction D3, for example. For example, when the conductor portion 33*a* includes the first conductor portion, the conductor portion 33*b* includes the second conductor portion.

The internal conductor 34 includes a conductor portion 34*a* and a conductor portion 34*b*. The conductor portion 34*a* opposes the conductor portion 33*a* in the first direction D1. The conductor portion 34*b* extends in the first direction D1 and is connected to the internal conductor 33. The conductor portion 34*b* includes a region 34*c* and a region 34*d*. The region 34*c* is connected to the conductor portion 33*b*. The region 34*c* is physically and electrically connected to the conductor portion 33*b*, for example. The region 34*d* is continuous with the region 34*c* and is continuous with the conductor portion 34*a*. In the present example, the region 34*d* is continuous with the region 34*c* in the first direction D1, and is continuous with the conductor portion 34*a* in the second direction D2 and the third direction D3. The conductor portion 34*b* is positioned in the through hole 35*d*. For example, when the conductor portion 34*a* includes the third conductor portion, the conductor portion 34*b* includes the fourth conductor portion. For example, when the conductor portion 34*a* includes the third conductor portion, the conductor portion 34*b* includes the connection portion. For example, when the region 34*c* includes the first region, the region 34*d* includes the second region. A thicknesses of the conductor portion 33*a* and the conductor portion 34*a* are, for example, 2 μm.

As illustrated in FIG. 6, the conductor portion 34*b* has a thickness increasing toward a center line CL1 of the through hole 35*d* in the first direction D1. Therefore, in the region 34*c* and the region 34*d*, the thickness in the first direction D1 increases toward the center line CL1. The region 34*c* and the region 34*d* have the total thickness of in the first direction D1 increasing toward the center line CL1 in a direction from the conductor portion 34*a* toward the conductor portion 33*a*. For example, the center line CL1 extends in the first direction D1.

In the present example, the region 34*c* has a thickness in the first direction D1, and the region 34*d* has a thickness in the first direction D1. A degree of increase in the thickness of the region 34*d* in the first direction D1 is different from a degree of increase in the thickness of the region 34*c* in the first direction D1. For example, the degree of increase in the of the region 34*d* in the first direction D1 is smaller than the degree of increase in the thickness of the region 34*c* in the first direction D1. Therefore, the degree of increase in the thickness of the conductor portion 34*b* in the first direction D1 decreases, for example, at a boundary between the region 34*d* and the region 34*c*. The degree of increase in the thickness of the region 34*d* in the first direction D1 may be larger than the degree of increase in the thickness of the region 34*c* in the first direction D1. The degree of increase in the thickness of the region 34*d* in the first direction D1 may be substantially the same as the degree of increase in the thickness of the region 34*c* in the first direction D1. For example, when the thickness of the region 34*c* in the first direction D1 includes a first thickness, the thickness of the region 34*d* in the first direction D1 includes a second thickness.

In the present example, the first direction D1 includes a direction D1*a* from the internal conductor 33 toward the internal conductor 34 and a direction D1*b* from the internal conductor 34 toward the internal conductor 33. The region 34*d* includes a region portion 34*d*1 and a region portion 34*d*2. The region portion 34*d*1 has a thickness in the direction D1*b* from a reference plane SP1. The region portion 34*d*2 has a thickness in the direction D1*a* from the reference plane SP1. The reference plane SP1 is a plane orthogonal to the first direction D1 and including the conductor portion 34*a*. A thickness of each of the region portions 34*d*1 and 34*d*2 in the first direction D1 increases toward the center line CL1. For example, when the direction D1*a* includes a first direction, the direction D1*b* includes a second direction.

When viewed in the first direction D1, the region 34*d* has, for example, a circular shape. When viewed in the first direction D1, the region 34*c* and the conductor portion 33*b* have, for example, a circular shape. The region 34*d* extends to the outside of the conductor portion 33*b* over the entire circumference of the conductor portion 33*b* when viewed in the first direction D1. Therefore, for example, when viewed in the first direction D1, the circular shape of the region 34*d* includes the circular shape of the conductor portion 33*b* and extends to the outer side of the circular shape of the conductor portion 33*b*.

The second region 34*d* is formed with a recess 36 at an end portion 34*f* distant from the region 34*c* in the first direction D1. The recess 36 has, for example, a circular shape when viewed in the first direction D1. The recess 36 is filled with, for example, the body portion 5*e*. The recess 36 is open in a direction from the conductor portion 33*a* toward the conductor portion 34*a*. The recess 36 includes, for example, an opening edge 36*a*, a bottom 36*b*, and an inclined portion 36*c*. The inclined portion 36*c* couples the opening edge 36*a* and the bottom 36*b*. A depth of the recess 36 increases from the opening edge 36*a* toward the bottom 36*b*. The opening edge 36*a* defines an outer peripheral edge of the recess 36 when viewed in the first direction D1. When viewed in the first direction D1, the conductor portion 33*b* is located inside the outer peripheral edge of the recess 36. The bottom 36*b* has, for example, a circular shape when viewed in the first direction D1. A width of the bottom 36*b* is smaller than a width of the opening edge 36*a*, that is, an opening width W1. The inclined portion 36*c* is formed such that the width of the bottom 36*b* is smaller than the opening width W1, for example. The bottom 36*b* intersects with the center line CL1, for example. A central axis of the recess 36 substantially coincides with the center line CL1, for example.

In the present example, the conductor portion 33*b* includes an outer edge, and the entire outer edge is positioned inside an outer edge of the region 34*d* when viewed in the first direction D1. Therefore, the opening width W1 is larger than the width W2 of the conductor portion 33*b*, for example. Therefore, the recess 36 extends to the outside of the conductor portion 33*b* over the entire circumference of the conductor portion 33*b* when viewed in the first direction D1. The opening width W1 may be smaller than the width W2 of the conductor portion 33*b*, and may be substantially the same as the width W2 of the conductor portion 33*b*.

A length H1 of the region 34*c* in the first direction D1 is, for example, smaller than a distance H2 between the bottom 36*b* and the conductor portion 33*b* in the first direction D1. The distance H2 is a distance from the bottom 36*b* to the conductor portion 33*b* in the first direction D1. Therefore, a position where the degree of increase in the thickness of the conductor portion 34*b* changes is closer to the conductor portion 33*b* than the bottom 36*b* in the first direction D1. The length H1 may be greater than the distance H2 and may be substantially the same as the distance H2. Since the recess 36 is formed, the thickness of the conductor portion 34*b* in the first direction D1 decreases.

As illustrated in FIG. 6, the conductor portion 34*b* includes a region 34*p* and a region 34*q*. The region 34*p* includes the first material. The region 34*q* includes the second material. A linear expansion coefficient of the second material is different from a linear expansion coefficient of the first material. The first material included in the region 34*p* is, for example, the same as the first material included in the region 32*p*. The second material included in the region 34*q* is, for example, the same as the second material included in the region 32*q*.

The conductor portion 34*b* includes, for example, a plurality of the regions 34*q*. The plurality of regions 34*q* are distributed in the region 34*p*. The plurality of regions 34*q* are uniformly distributed in the region 34*p*, for example. In this case, the region 34*p* does not include a region in which the plurality of regions 34*q* are unevenly distributed as compared with other regions.

Each of the regions 34*q* includes, for example, a protruding portion 34*r*. The portion 34*r* protrudes toward the piezoelectric body 1. Therefore, the region 34*q* is in contact with the piezoelectric body 1, for example. The region 34*q* may be integrated with the piezoelectric body 1, for example.

The region 34*q* is positioned in at least one of the region 34*c* and the region 34*d*. Therefore, the region 34*q* is positioned in both the region 34*c* and the region 34*d*, for example. For example, the region 34*q* is positioned in the region 34*c* and is not positioned in the region 34*d*. For example, the region 34*q* is positioned in the region 34*d* and is not positioned in the region 34*c*.

The region 34*q* is positioned, for example, in a region 34*s* including a surface defining the recess 36 in the region 34*d*. In the present example, the region 34*q* is positioned in, for example, the region 34*c*, the region 34*d*, and the region 34*s*. For example, the region 34*q* is positioned in the region 34*c* and the region 34*s* and is not positioned in the region 34*d*. For example, the region 34*q* is positioned in the region 34*d* and the region 34*s*, and is not positioned in the region 34*c*. The region 34*q* may not be positioned in the region 34*s*. In the regions 34*c*, 34*d*, and 34*s*, when the region 34*q* is positioned, for example, the portion 34*r* may protrude toward the piezoelectric body 1.

As illustrated in FIG. 6, a cavity 50 is formed in the conductor portion 34*b*. In the present example, one or a plurality of the cavities 50 are formed. FIG. 6 illustrates an example in which the plurality of cavities 50 are formed. The same gas as the inert gas included in the cavity 50 formed in the conductor portion 32*b* is included in the cavity 50, for example. The concentration of the inert gas is, for example, dilute. The cross section of the cavity 50 has a polygonal shape.

The plurality of cavities 50 are formed to be distributed in the conductor portion 34*b*. The plurality of cavities 50 are formed to be uniformly distributed in the conductor portion 34*b*, for example. In this case, the conductor portion 34*b* does not include a region in which the plurality of cavities 50 are unevenly distributed as compared with other regions.

The cavity 50 is formed in at least one of the region 34*c* and the region 34*d*. Therefore, the cavity 50 is formed in both the region 34*c* and the region 34*d*, for example. The cavity 50 is formed in the region 34*c*, for example, and is not formed in the region 34*d*. The cavity 50 is formed in the region 34*d*, for example, and is not formed in the region 34*c*.

The cavity 50 is formed, for example, in a region 34*s* including a surface defining the recess 36 in the region 34*c*. In the present example, the cavity 50 is formed in, for example, the region 34*c*, the region 34*d*, and the region 34*s*. The cavity 50 is formed in the region 34*c* and the region 34*s*, for example, and is not formed in the region 34*d*. The cavity 50 is positioned, for example, in the region 34*d* and the region 34*s*, and is not formed in the region 34*c*. The cavity 50 may not be formed in the region 34*s*.

In the conductor portion 34*b*, a recess 51 opened at the outer peripheral surface of the conductor portion 34*b* is formed. In the present example, for example, a plurality of the recesses 51 are formed. Each of the recesses 51 is filled with the piezoelectric body 1. In the example illustrated in FIG. 6, the body portions 5*d* and 5*e* are filled in each of the recesses 51.

Figure 7:
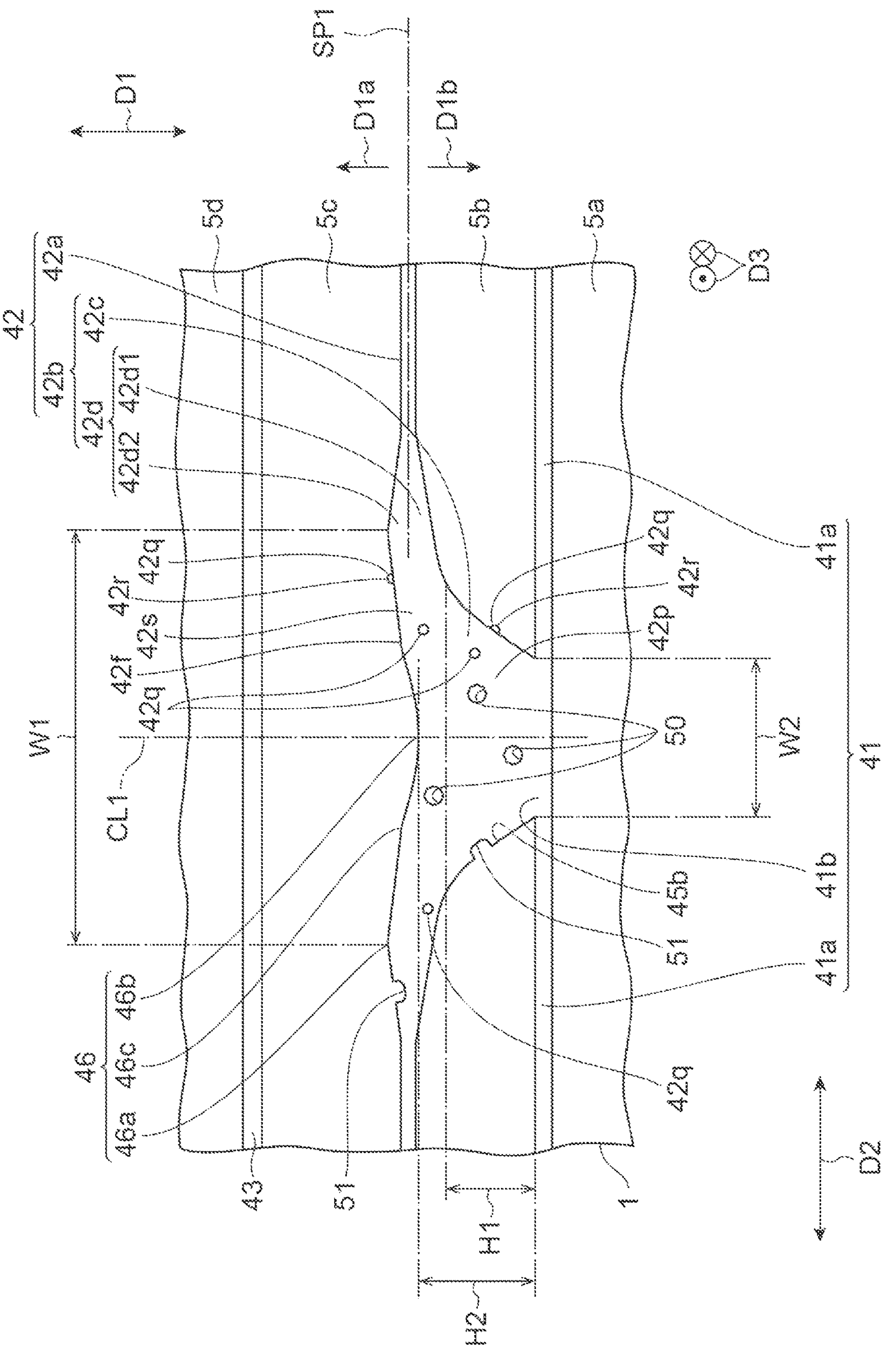
FIG. 7 is a diagram illustrating a configuration of the internal conductor.

FIG. 7 is a diagram illustrating a configuration of the internal conductors 41 and 42. As illustrated in FIG. 7, the internal conductor 41 includes a conductor portion 41*a* and a conductor portion 41*b*. The conductor portion 41*a* and the conductor portion 41*b* are continuous with each other. The conductor portion 41*a* and the conductor portion 41*b* are continuous with each other in the second direction D2 and the third direction D3, for example. For example, when the conductor portion 41*a* includes the first conductor portion, the conductor portion 41*b* includes the second conductor portion.

The internal conductor 42 includes a conductor portion 42*a* and a conductor portion 42*b*. The conductor portion 42*a* opposes the conductor portion 41*a* in the first direction D1. The conductor portion 42*b* extends in the first direction D1 and is connected to the internal conductor 41. The conductor portion 42*b* includes a region 42*c* and a region 42*d*. The region 42*c* is connected to the conductor portion 41*b*. The region 42*c* is physically and electrically connected to the conductor portion 41*b*, for example. The region 42*d* is continuous with the region 42*c* and is continuous with the conductor portion 42*a*. In the present example, the region 42*d* is continuous with the region 42*c* in the first direction D1, and is continuous with the conductor portion 42*a* in the second direction D2 and the third direction D3. The conductor portion 42*b* is positioned in the through hole 45*b*. For example, when the conductor portion 42*a* includes the third conductor portion, the conductor portion 42*b* includes the fourth conductor portion. For example, when the conductor portion 42*a* includes the third conductor portion, the conductor portion 42*b* includes the connection portion. For example, when the region 42*c* includes the first region, the region 42*d* includes the second region. A thicknesses of the conductor portion 41*a* and the conductor portion 42*a* are, for example, 2 μm to 2.5 μm.

As illustrated in FIG. 7, the conductor portion 42*b* has a thickness increasing toward a center line CL1 of the through hole 45*b* in the first direction D1. Therefore, in the region 42*c* and the region 42*d*, the thickness in the first direction D1 increases toward the center line CL1. The region 42*c* and the region 42*d* have the total thickness of in the first direction D1 increasing toward the center line CL1 in a direction from the conductor portion 42*a* toward the conductor portion 41*a*. For example, the center line CL1 extends in the first direction D1.

In the present example, the region 42*c* has a thickness in the first direction D1, and the region 42*d* has a thickness in the first direction D1. A degree of increase in the thickness of the region 42*d* in the first direction D1 is different from a degree of increase in the thickness of the region 42*c* in the first direction D1. For example, the degree of increase in the thickness of the region 42*d* in the first direction D1 is smaller than the degree of increase in the thickness of the region 42*c* in the first direction D1. Therefore, the degree of increase in the thickness of the conductor portion 42*b* in the first direction D1 decreases, for example, at a boundary between the region 42*d* and the region 42*c*. The degree of increase in the thickness of the region 42*d* in the first direction D1 may be larger than the degree of increase in the thickness of the region 42*c* in the first direction D1. The degree of increase in the thickness of the region 42*d* in the first direction D1 may be substantially the same as the degree of increase in the thickness of the region 42*c* in the first direction D1. For example, when the thickness of the region 42*c* in the first direction D1 includes a first thickness, the thickness of the region 42*d* in the first direction D1 includes a second thickness.

In the present example, the first direction D1 includes a direction D1*a* from the internal conductor 41 toward the internal conductor 42 and a direction D1*b* from the internal conductor 42 toward the internal conductor 41. The region 42*d* includes a region portion 42*d*1 and a region portion 42*d*2. The region portion 42*d*1 has a thickness in the direction D1*b* from a reference plane SP1. The region portion 42*d*2 has a thickness in the direction D1*a* from the reference plane SP1. The reference plane SP1 is a plane orthogonal to the first direction D1 and including the conductor portion 42*a*. A thickness of each of the region portions 42*d*1 and 42*d*2 in the first direction D1 increases toward the center line CL1. For example, when the direction D1*a* includes a first direction, the direction D1*b* includes a second direction.

When viewed in the first direction D1, the region 42*d* has, for example, a circular shape. When viewed in the first direction D1, the region 42*c* and the conductor portion 41*b* have, for example, a circular shape. The region 42*d* extends to the outside of the conductor portion 41*b* over the entire circumference of the conductor portion 41*b* as viewed in the first direction D1. Therefore, for example, when viewed in the first direction D1, the circular shape of the region 42*d* includes the circular shape of the conductor portion 41*b* and extends to the outer side of the circular shape of the conductor portion 41*b*.

The second region 42*d* is formed with a recess 46 at an end portion 42*f* distant from the region 42*c* in the first direction D1. The recess 46 has, for example, a circular shape when viewed in the first direction D1. The recess 46 is filled with, for example, the body portion 5*c*. The recess 46 is open in a direction from the conductor portion 41*a* toward the conductor portion 42*a*. The recess 46 includes, for example, an opening edge 46*a*, a bottom 46*b*, and an inclined portion 46*c*. The inclined portion 46*c* couples the opening edge 46*a* and the bottom 46*b*. A depth of the recess 46 increases from the opening edge 46*a* toward the bottom 46*b*. The opening edge 46*a* defines an outer peripheral edge of the recess 46 when viewed in the first direction D1. When viewed in the first direction D1, the conductor portion 41*b* is located inside the outer peripheral edge of the recess 46. The bottom 46*b* has, for example, a circular shape when viewed in the first direction D1. A width of the bottom 46*b* is smaller than a width of the opening edge 46*a*, that is, an opening width W1. The inclined portion 46*c* is formed such that a width of the bottom 46*b* is smaller than the opening width W1, for example. The bottom 46*b* intersects with the center line CL1, for example. A central axis of the recess 46 substantially coincides with the center line CL1, for example. The recess 46 has a depth increasing toward the center line CL1.

In the present example, the conductor portion 41*b* includes an outer edge, and the entire outer edge is positioned inside an outer edge of the region 42*d* when viewed in the first direction D1. Therefore, the opening width W1 is larger than the width W2 of the conductor portion 41*b*, for example. Therefore, the recess 46 extends to the outside of the conductor portion 41*b* over the entire circumference of the conductor portion 41*b* when viewed in the first direction D1. The opening width W1 may be smaller than the width W2 of the conductor portion 41*b*, and may be substantially the same as the width W2 of the conductor portion 41*b*.

A length H1 of the region 42*c* in the first direction D1 is, for example, smaller than a distance H2 between the bottom 46*b* and the conductor portion 41*b* in the first direction D1. The distance H2 is a distance from the bottom 46*b* to the conductor portion 41*b* in the first direction D1. Therefore, a position where the degree of increase in the thickness of the conductor portion 42*b* changes is closer to the conductor portion 41*b* than the bottom 46*b* in the first direction D1. The length H1 may be greater than the distance H2 and may be substantially the same as the distance H2. Since the recess 46 is formed, the thickness of the conductor portion 42*b* in the first direction D1 decreases.

As illustrated in FIG. 7, the conductor portion 42*b* includes a region 42*p* and a region 42*q*. The region 42*p* includes the first material. The region 42*q* includes the second material. A linear expansion coefficient of the second material is different from a linear expansion coefficient of the first material. The first material included in the region 42*p* is, for example, the same as the first material included in the region 32*p*. The second material included in the region 42*q* is, for example, the same as the second material included in the region 32*q*.

The conductor portion 42*b* includes, for example, a plurality of the regions 42*q*. The plurality of regions 42*q* are distributed in the region 42*p*. The plurality of regions 42*q* are uniformly distributed in the region 42*p*, for example. In this case, the region 42*p* does not include a region in which the plurality of regions 42*q* are unevenly distributed as compared with other regions.

Each of the regions 42*q* includes, for example, a protruding portion 42*r*. The portion 42*r* protrudes toward the piezoelectric body 1. Therefore, the region 42*q* is in contact with the piezoelectric body 1, for example. The region 42*q* may be integrated with the piezoelectric body 1, for example.

The region 42*q* is positioned in at least one of the regions 42*c* and 42*d*. Therefore, the region 42*q* is positioned in both the region 42*c* and the region 42*d*, for example. For example, the region 42*q* is positioned in the region 42*c* and is not positioned in the region 42*d*. For example, the region 42*q* is positioned in the region 42*d* and is not positioned in the region 42*c*.

The region 42*q* is positioned, for example, in a region 42*s* including a surface defining the recess 46 in the region 42*d*. In the present example, the region 42*q* is positioned in, for example, the region 42*c*, the region 42*d*, and the region 42*s*. For example, the region 42*q* is positioned in the region 42*c* and the region 42*s*, and is not positioned in the region 42*d*. For example, the region 42*q* is positioned in the region 42*d* and the region 42*s*, and is not positioned in the region 42*c*. The region 42*q* may not be positioned in the region 42*s*. In the regions 42*c*, 42*d*, and 42*s*, when the region 42*q* is positioned, for example, the portion 42*r* may protrude toward the piezoelectric body 1.

As illustrated in FIG. 7, a cavity 50 is formed in the conductor portion 42*b*. In the present example, one or a plurality of cavities 50 are formed, and FIG. 7 illustrates an example in which the plurality of cavities 50 are formed. The same gas as the inert gas included in the cavity 50 formed in the conductor portion 32*b* is included in the cavity 50, for example. The concentration of the inert gas is, for example, dilute. The cross section of the cavity 50 has a polygonal shape.

The plurality of cavities 50 are formed to be distributed in the conductor portion 42*b*. The plurality of cavities 50 are formed to be uniformly distributed in the conductor portion 42*b*, for example. In this case, the conductor portion 42*b* does not include a region in which the plurality of cavities 50 are unevenly distributed as compared with other regions. One of the cavities 50 is formed, for example, in a central portion of the conductor portion 42*b*.

The cavity 50 is formed in at least one of the region 42*c* and the region 42*d*. Therefore, the cavity 50 is formed in both the region 42*c* and the region 42*d*, for example. The cavity 50 is formed in the region 42*c*, for example, and is not formed in the region 42*d*. The cavity 50 is formed in the region 42*d*, for example, and is not formed in the region 42*c*.

The cavity 50 is formed, for example, in a region 42*s* including a surface defining the recess 46 in the region 42*c*. In the present example, the cavity 50 is formed in, for example, the region 42*c*, the region 42*d*, and the region 42*s*. The cavity 50 is formed in the region 42*c* and the region 42*s*, for example, and is not formed in the region 42*d*. The cavity 50 is positioned, for example, in the region 42*d* and the region 42*s*, and is not formed in the region 42*c*. The cavity 50 may not be formed in the region 42*s*.

In the conductor portion 42*b*, a recess 51 opened at the outer peripheral surface of the conductor portion 42*b* is formed. In the present example, for example, a plurality of the recesses 51 are formed. Each of the recesses 51 is filled with the piezoelectric body 1. In the example illustrated in FIG. 7, the body portions 5*b* and 5*c* are filled in each of the recesses 51.

Figure 8:
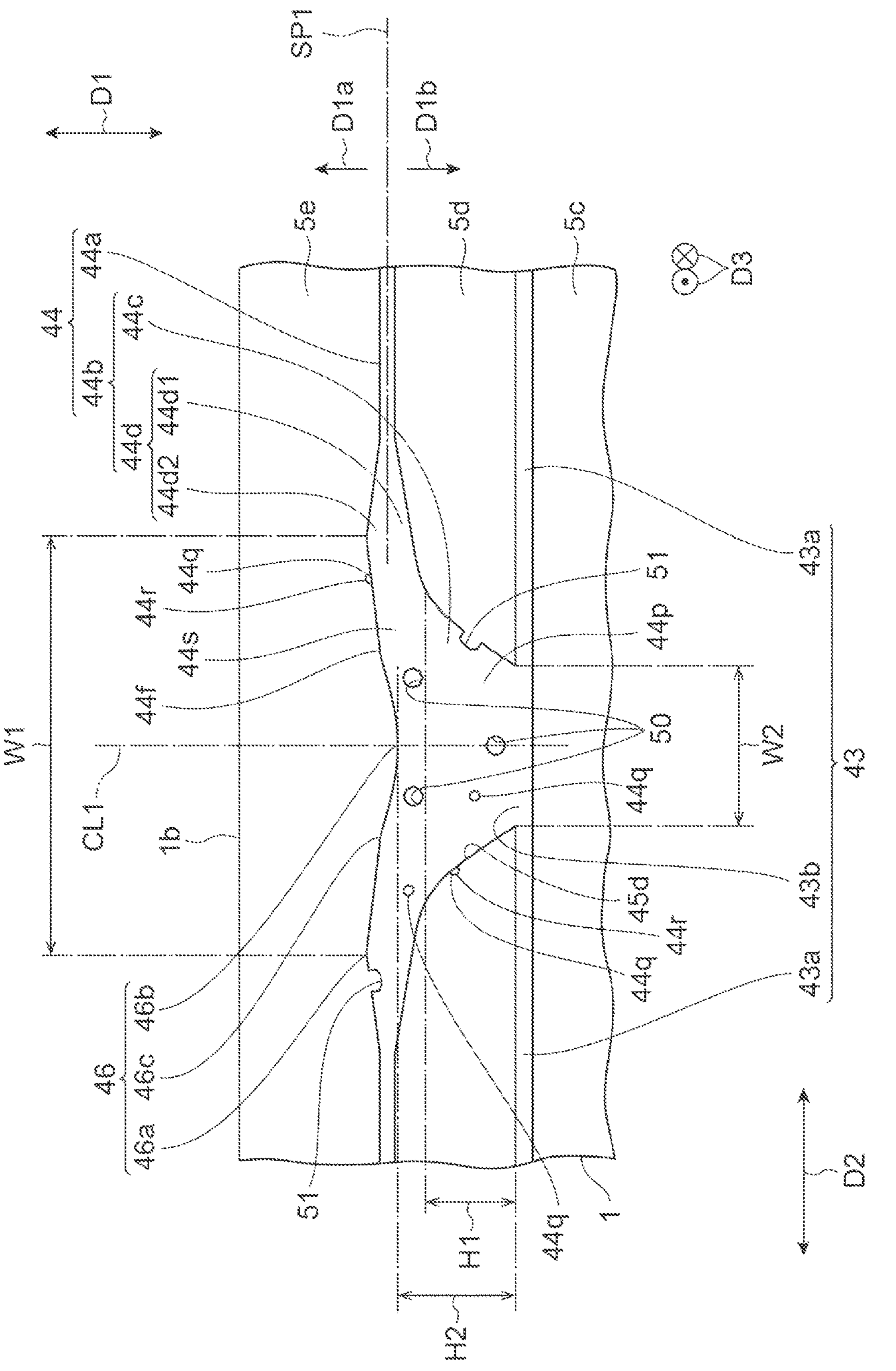
FIG. 8 is a diagram illustrating a configuration of the internal conductor.

FIG. 8 is a diagram illustrating a configuration of the internal conductors 43 and 44. As illustrated in FIG. 8, the internal conductor 43 includes a conductor portion 43*a* and a conductor portion 43*b*. The conductor portion 43*a* and the conductor portion 43*b* are continuous with each other. The conductor portion 43*a* and the conductor portion 43*b* are continuous with each other in the second direction D2 and the third direction D3, for example. For example, when the conductor portion 43*a* includes the first conductor portion, the conductor portion 43*b* includes the second conductor portion.

The internal conductor 44 includes a conductor portion 44*a* and a conductor portion 44*b*. The conductor portion 44*a* opposes the conductor portion 43*a* in the first direction D1. The conductor portion 44*b* extends in the first direction D1 and is connected to the internal conductor 43. The conductor portion 44*b* includes a region 44*c* and a region 44*d*. The region 44*c* is connected to the conductor portion 43*b*. The region 44*c* is physically and electrically connected to the conductor portion 43*b*, for example. The region 44*d* is continuous with the region 44*c* and is continuous with the conductor portion 44*a*. In the present example, the region 44*d* is continuous with the region 44*c* in the first direction D1, and is continuous with the conductor portion 44*a* in the second direction D2 and the third direction D3. The conductor portion 44*b* is positioned in the through hole 45*d*. For example, when the conductor portion 44*a* includes the third conductor portion, the conductor portion 44*b* includes the fourth conductor portion. For example, when the conductor portion 44*a* includes the third conductor portion, the conductor portion 44*b* includes the connection portion. For example, when the region 44*c* includes the first region, the region 44*d* includes the second region. A thicknesses of the conductor portion 43*a* and the conductor portion 44*a* are, for example, 2 μm to 2.5 μm.

As illustrated in FIG. 8, the conductor portion 44*b* has a thickness increasing toward a center line CL1 of the through hole 45*d* in the first direction D1. Therefore, in the region 44*c* and the region 44*d*, the thickness in the first direction D1 increases toward the center line CL1. The region 44*c* and the region 44*d* have the total thickness of in the first direction D1 increasing toward the center line CL1 in a direction from the conductor portion 44*a* toward the conductor portion 43*a*. For example, the center line CL1 extends in the first direction D1.

In the present example, the region 44*c* has a thickness in the first direction D1, and the region 44*d* has a thickness in the first direction D1. A degree of increase in the thickness of the region 44*d* in the first direction D1 is different from a degree of increase in the thickness of the region 44*c* in the first direction D1. For example, the degree of increase in the thickness of the region 44*d* in the first direction D1 is smaller than the degree of increase in the thickness of the region 44*c* in the first direction D1. Therefore, the degree of increase in the thickness of the conductor portion 44*b* in the first direction D1 decreases, for example, at a boundary between the region 44*d* and the region 44*c*. The degree of increase in the thickness of the region 44*d* in the first direction D1 may be larger than the degree of increase in the thickness of the region 44*c* in the first direction D1. The degree of increase in the thickness of the region 44*d* in the first direction D1 may be substantially the same as the degree of increase in the thickness of the region 44*c* in the first direction D1. For example, when the thickness of the region 44*c* in the first direction D1 includes a first thickness, the thickness of the region 44*d* in the first direction D1 includes a second thickness.

In the present example, the first direction D1 includes a direction D1*a* from the internal conductor 43 toward the internal conductor 44 and a direction D1*b* from the internal conductor 44 toward the internal conductor 43. The region 44*d* includes a region portion 44*d*1 and a region portion 44*d*2. The region portion 44*d*1 has a thickness in the direction D1*b* from a reference plane SP1. The region portion 44*d*2 has a thickness in the direction D1*a* from the reference plane SP1. The reference plane SP1 is a plane orthogonal to the first direction D1 and including the conductor portion 44*a*. A thickness of each of the region portions 44*d*1 and 44*d*2 in the first direction D1 increases toward the center line CL1. For example, when the direction D1*a* includes a first direction, the direction D1*b* includes a second direction.

When viewed in the first direction D1, the region 44*d* has, for example, a circular shape. When viewed in the first direction D1, the region 44*c* and the conductor portion 43*b* have, for example, a circular shape. The region 44*d* extends to the outside of the conductor portion 43*b* over the entire circumference of the conductor portion 43*b* when viewed in the first direction D1. Therefore, for example, when viewed in the first direction D1, the circular shape of the region 44*d* includes the circular shape of the conductor portion 43*b* and extends to the outer side of the circular shape of the conductor portion 43*b*.

The second region 44*d* is formed with a recess 46 at an end portion 44*f* distant from the region 44*c* in the first direction D1. The recess 46 has, for example, a circular shape when viewed in the first direction D1. The recess 46 is filled with, for example, the body portion 5*c*. The recess 46 is open in a direction from the conductor portion 43*a* toward the conductor portion 44*a*. The recess 46 includes, for example, an opening edge 46*a*, a bottom 46*b*, and an inclined portion 46*c*. The inclined portion 46*c* couples the opening edge 46*a* and the bottom 46*b*. A depth of the recess 46 increases from the opening edge 46*a* toward the bottom 46*b*. The opening edge 46*a* defines an outer peripheral edge of the recess 46 when viewed in the first direction D1. When viewed in the first direction D1, the conductor portion 43*b* is located inside the outer peripheral edge of the recess 46. The bottom 46*b* has, for example, a circular shape when viewed in the first direction D1. A width of the bottom 46*b* is smaller than a width of the opening edge 46*a*, that is, an opening width W1. The inclined portion 46*c* is formed such that a width of the bottom 46*b* is smaller than the opening width W1, for example. The bottom 46*b* intersects with the center line CL1, for example. A central axis of the recess 46 substantially coincides with the center line CL1, for example.

In the present example, the conductor portion 43*b* includes an outer edge, and the entire outer edge is positioned inside an outer edge of the region 44*d* when viewed in the first direction D1. Therefore, the opening width W1 is larger than the width W2 of the conductor portion 43*b*, for example. Therefore, the recess 46 extends to the outside of the conductor portion 43*b* over the entire circumference of the conductor portion 43*b* when viewed in the first direction D1. The opening width W1 may be smaller than the width W2 of the conductor portion 43*b*, and may be substantially the same as the width W2 of the conductor portion 43*b*.

A length H1 of the region 44*c* in the first direction D1 is, for example, smaller than a distance H2 between the bottom 46*b* and the conductor portion 43*b* in the first direction D1. The distance H2 is a distance from the bottom 46*b* to the conductor portion 43*b* in the first direction D1. Therefore, a position where the degree of increase in the thickness of the conductor portion 44*b* changes is closer to the conductor portion 43*b* than the bottom 46*b* in the first direction D1. The length H1 may be greater than the distance H2 and may be substantially the same as the distance H2. Since the recess 46 is formed, the thickness of the conductor portion 44*b* in the first direction D1 decreases.

As illustrated in FIG. 8, the conductor portion 44*b* includes a region 44*p* and a region 44*q*. The region 44*p* includes the first material. The region 44*q* includes the second material. A linear expansion coefficient of the second material is different from a linear expansion coefficient of the first material. The first material included in the region

44*p* is, for example, the same as the first material included in the region 32*p*. The second material included in the region 44*q* is, for example, the same as the second material included in the region 32*q*.

The conductor portion 44*b* includes, for example, a plurality of the regions 44*q*. The plurality of regions 44*q* are distributed in the region 44*p*. The plurality of regions 44*q* are uniformly distributed in the region 44*p*, for example. In this case, the region 44*p* does not include a region in which the plurality of regions 44*q* are unevenly distributed as compared with other regions.

Each of the regions 44*q* includes, for example, a protruding portion 44*r*. The portion 44*r* protrudes toward the piezoelectric body 1. Therefore, the region 44*q* is in contact with the piezoelectric body 1, for example. The region 44*q* may be integrated with the piezoelectric body 1, for example.

The region 44*q* is positioned in at least one of the region 44*c* and the region 44*d*. Therefore, the region 44*q* is positioned in both the region 44*c* and the region 44*d*, for example. For example, the region 44*q* is positioned in the region 44*c* and is not positioned in the region 44*d*. For example, the region 44*q* is positioned in the region 44*d* and is not positioned in the region 44*c*.

The region 44*q* is positioned, for example, in a region 44*s* including a surface defining the recess 46 in the region 44*d*. In the present example, the region 44*q* is positioned in, for example, the region 44*c*, the region 44*d*, and the region 44*s*. For example, the region 44*q* is positioned in the region 44*c* and the region 44*s*, and is not positioned in the region 44*d*. For example, the region 44*q* is positioned in the region 44*d* and the region 44*s*, and is not positioned in the region 44*c*. The region 44*q* may not be positioned in the region 44*s*. In the regions 44*c*, 44*d*, and 44*s*, when the region 44*q* is positioned, for example, the portion 44*r* may protrude toward the piezoelectric body 1.

As illustrated in FIG. 8, a cavity 50 is formed in the conductor portion 44*b*. In the present example, one or a plurality of cavities 50 are formed, and FIG. 8 illustrates an example in which the plurality of cavities 50 are formed. The same gas as the inert gas included in the cavity 50 formed in the conductor portion 32*b* is included in the cavity 50, for example. The concentration of the inert gas is, for example, dilute. The cross section of the cavity 50 has a polygonal shape.

The plurality of cavities 50 are formed to be distributed in the conductor portion 44*b*. The plurality of cavities 50 are formed to be uniformly distributed in the conductor portion 44*b*, for example. In this case, the conductor portion 44*b* does not include a region in which the plurality of cavities 50 are unevenly distributed as compared with other regions. One of the cavities 50 is formed, for example, in a central portion of the conductor portion 44*b*.

The cavity 50 is formed in at least one of the region 44*c* and the region 44*d*. Therefore, the cavity 50 is formed in both the region 44*c* and the region 44*d*, for example. The cavity 50 is formed in the region 44*c*, for example, and is not formed in the region 44*d*. The cavity 50 is formed in the region 44*d*, for example, and is not formed in the region 44*c*.

The cavity 50 is formed, for example, in a region 44*s* including a surface defining the recess 46 in the region 44*c*. In the present example, the cavity 50 is formed in, for example, the region 44*c*, the region 44*d*, and the region 44*s*. The cavity 50 is formed in the region 44*c* and the region 44*s*, for example, and is not formed in the region 44*d*. The cavity 50 is positioned, for example, in the region 44*d* and the region 44*s*, and is not formed in the region 44*c*. The cavity 50 may not be formed in the region 44*s*.

In the conductor portion 44*b*, a recess 51 opened at the outer peripheral surface of the conductor portion 44*b* is formed. In the present example, for example, a plurality of the recesses 51 are formed. Each of the recesses 51 is filled with the piezoelectric body 1. In the example illustrated in FIG. 8, the body portions 5*d* and 5*e* are filled in each of the recesses 51.

Figure 9:
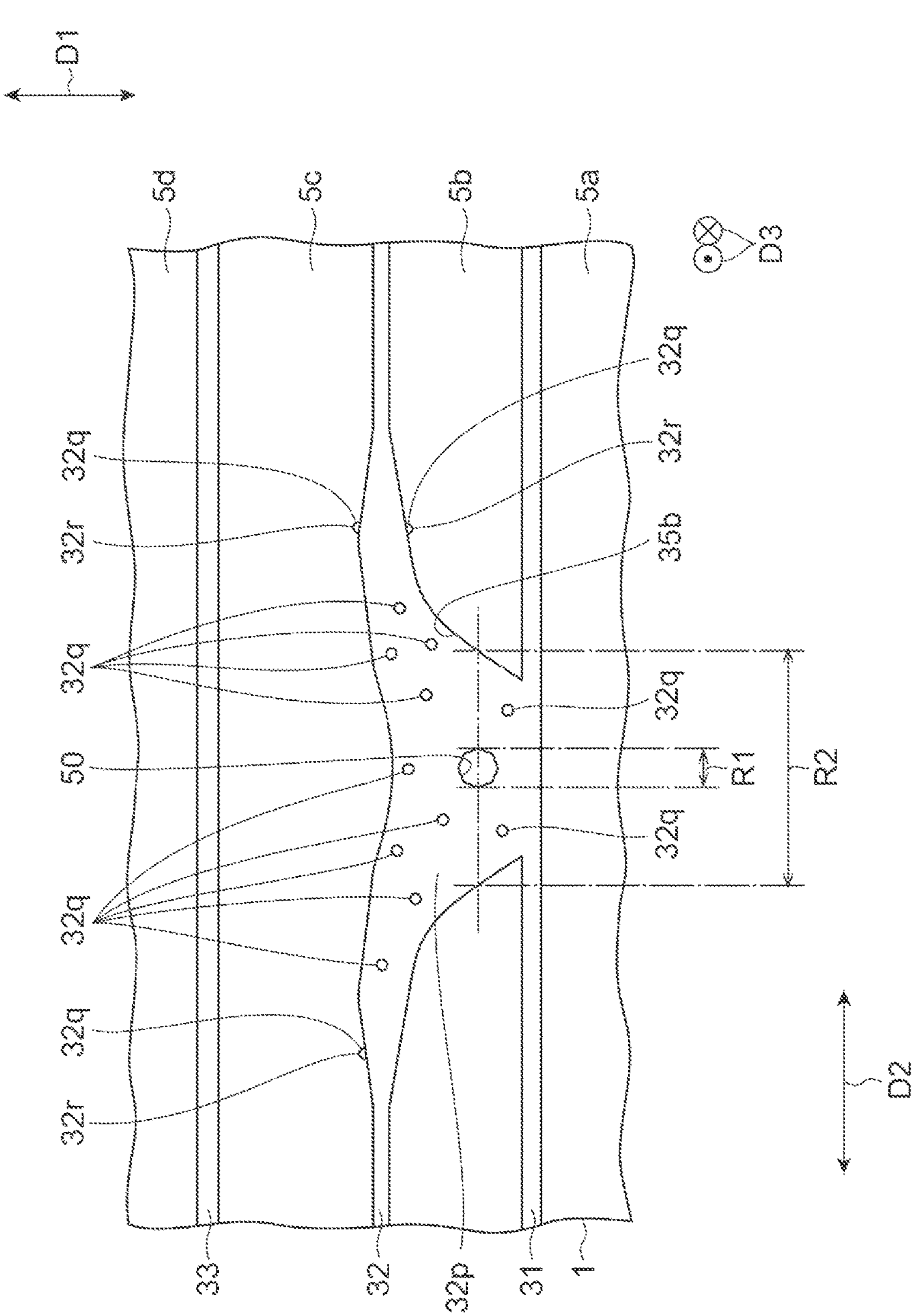
FIG. 9 is a diagram illustrating a configuration of the internal conductor.

FIG. 9 illustrates a cavity 50 formed in the conductor portion 32*b*. In the present example, one or a plurality of cavities 50 are formed, and FIG. 9 illustrates an example in which one cavity 50 is formed. One cavity 50 is formed, for example, in a central portion of the conductor portion 32*b*. Each of the cavities 50 includes, for example, an inert gas. The inert gas included in the cavity 50 is, for example, $N_2$ or $CO_2$. The concentration of the inert gas is, for example, dilute. The cross section of the cavity 50 has a polygonal shape.

As illustrated in FIG. 9, in a cross section including the cavity 50, an equivalent circle diameter R1 in the cross section of the cavity 50 is, for example, 50% or less of a width R2 in the cross section of the conductor portion 32*b*. In the present example, the equivalent circle diameter R1 at the cut surface of the cavity 50 is, for example, 20% or more of the width R2 at the cut surface of the conductor portion 32*b*.

Figure 10:
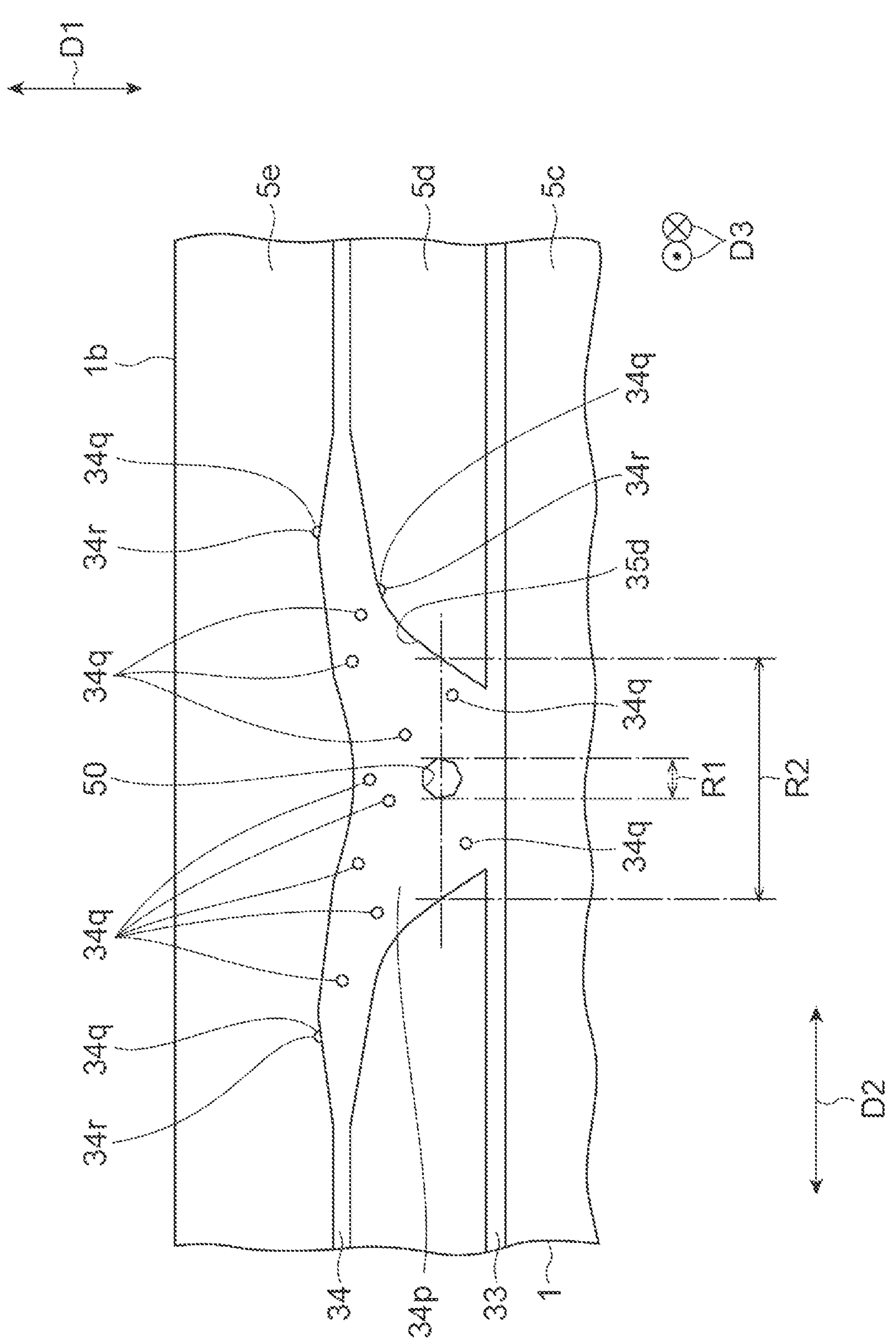
FIG. 10 is a diagram illustrating a configuration of the internal conductor.

FIG. 10 illustrates a cavity 50 formed in the conductor portion 34*b*. In the present example, one or a plurality of cavities 50 are formed, and FIG. 10 illustrates an example in which one cavity 50 is formed. One cavity 50 is formed, for example, in a central portion of the conductor portion 34*b*. The same gas as the inert gas included in the cavity 50 formed in the conductor portion 32*b* is included in the cavity 50, for example. The cross section of the cavity 50 has a polygonal shape.

As illustrated in FIG. 10, in the cross section including the cavity 50, an equivalent circle diameter R1 in the cross section of the cavity 50 is, for example, 50% or less of a width R2 in the cross section of the conductor portion 34*b*. In the present example, the equivalent circle diameter R1 at the cut surface of the cavity 50 is, for example, 20% or more of the width R2 at the cut surface of the conductor portion 34*b*.

Figure 11:
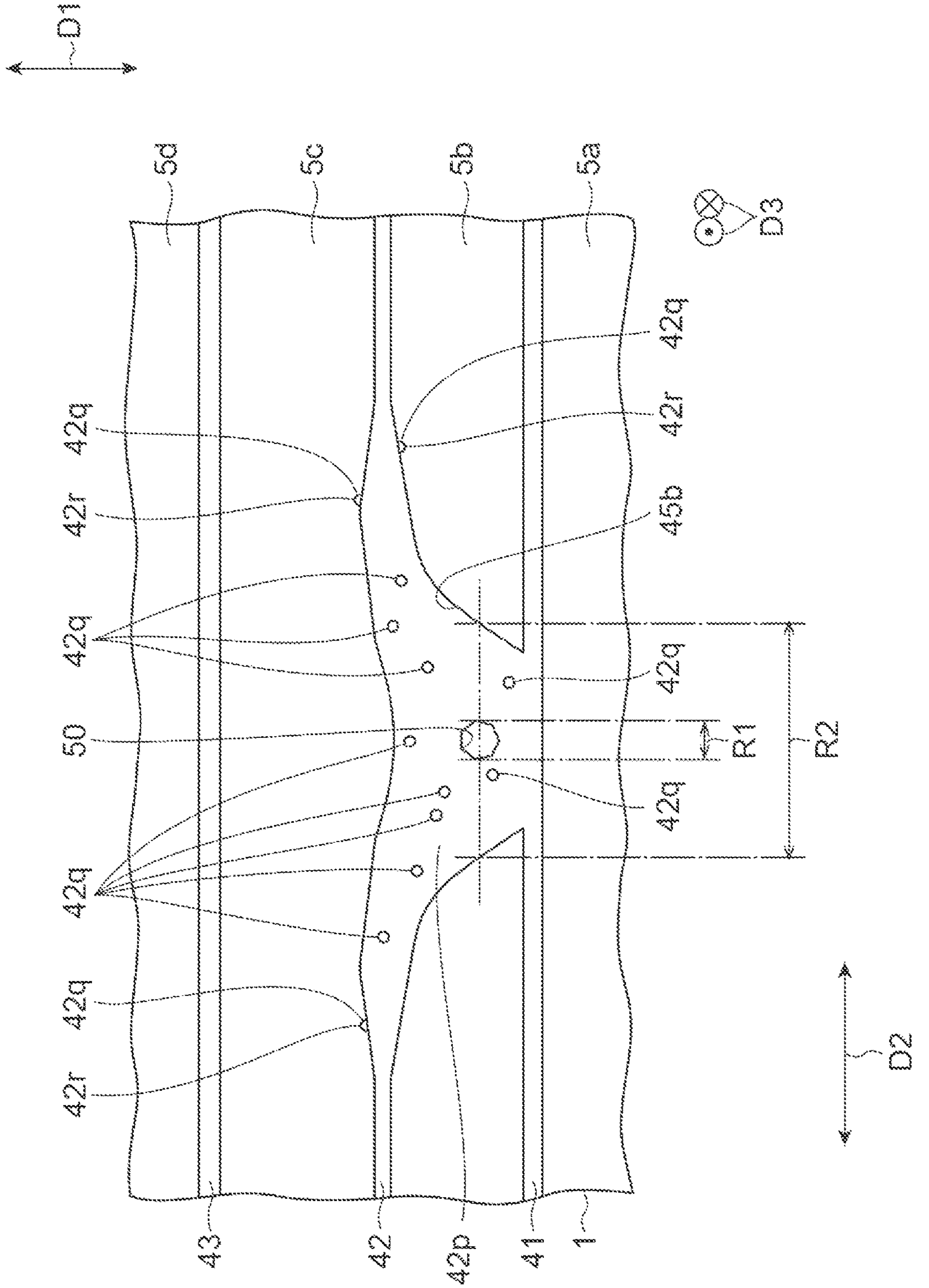
FIG. 11 is a diagram illustrating a configuration of the internal conductor.

FIG. 11 illustrates a cavity 50 formed in the conductor portion 42*b*. In the present example, one or a plurality of cavities 50 are formed, and FIG. 11 illustrates an example in which one cavity 50 is formed. One of the cavities 50 is formed, for example, in a central portion of the conductor portion 42*b*. The same gas as the inert gas included in the cavity 50 formed in the conductor portion 32*b* is included in the cavity 50, for example. The cross section of the cavity 50 has a polygonal shape.

As illustrated in FIG. 11, in the cross section including the cavity 50, an equivalent circle diameter R1 in the cross section of the cavity 50 is, for example, 50% or less of a width R2 in the cross section of the conductor portion 42*b*. In the present example, the equivalent circle diameter R1 at the cut surface of the cavity 50 is, for example, 15% or more of the width R2 at the cut surface of the conductor portion 42*b*.

Figure 12:
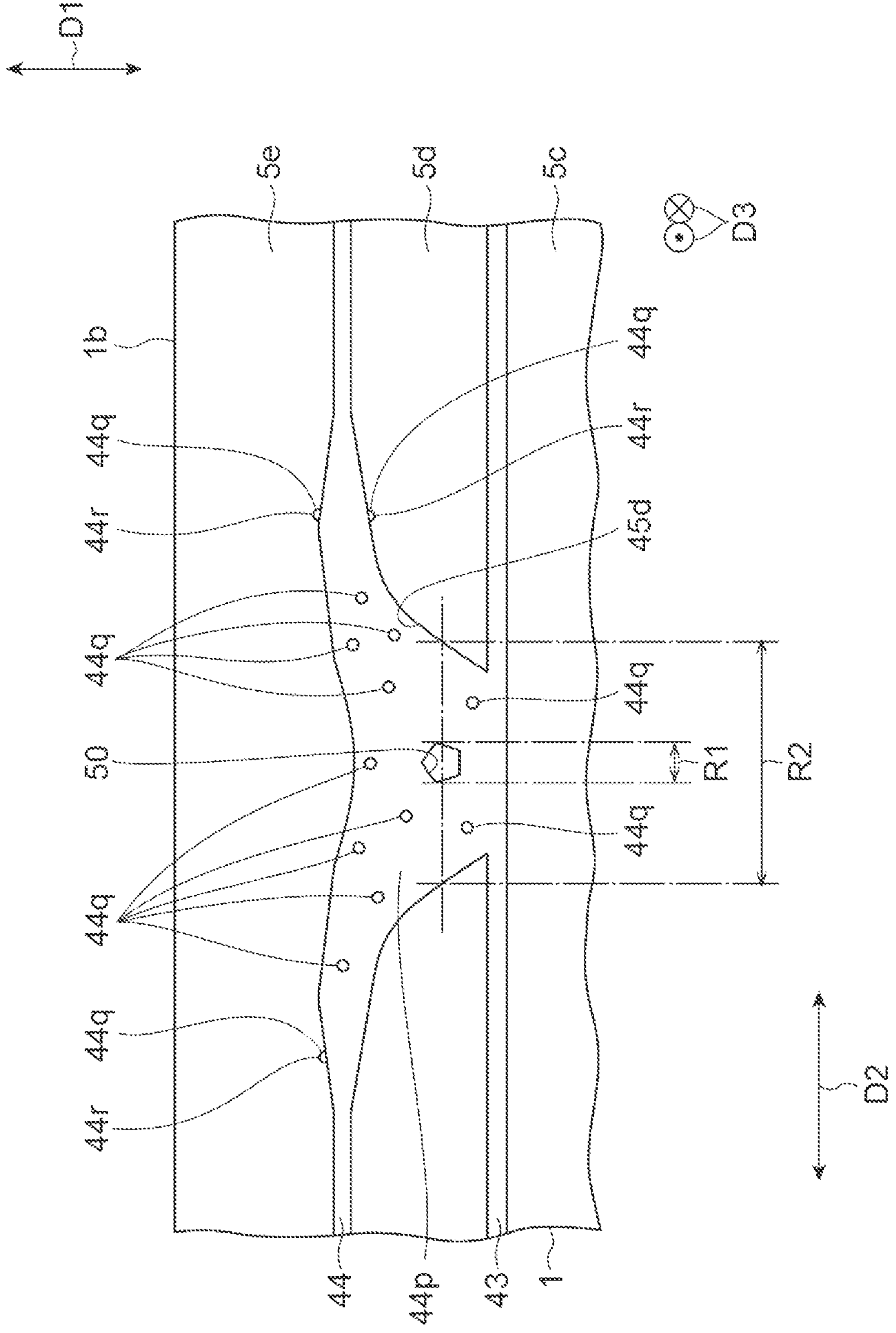
FIG. 12 is a diagram illustrating a configuration of the internal conductor.

FIG. 12 illustrates a cavity 50 formed in the conductor portion 44*b*. In the present example, one or a plurality of cavities 50 are formed, and FIG. 12 illustrates an example in which one cavity 50 is formed. One of the cavities 50 is formed, for example, in a central portion of the conductor portion 44*b*. The same gas as the inert gas included in the cavity 50 formed in the conductor portion 32*b* is included in the cavity 50, for example. The cross section of the cavity 50 has a polygonal shape.

As illustrated in FIG. 12, in the cross section including the cavity 50, an equivalent circle diameter R1 in the cross section of the cavity 50 is, for example, 50% or less of a width R2 in the cross section of the conductor portion 44*b*. In the present example, the equivalent circle diameter R1 at the cut surface of the cavity 50 is, for example, 15% or more of the width R2 at the cut surface of the conductor portion 44*b*.

An example of a method of making the piezoelectric element PD1 will be described. The order of the processes of the making method may be interchanged with each other. In an example of the making method, first, a piezoelectric ceramic powder, for example, PZT powder, is painted. Next, for example, a plurality of green sheets are formed through a doctor blade method. The plurality of green sheets are used to form the piezoelectric layers 3*a* to 3*e*. Each of the piezoelectric layers 3*a* to 3*e* corresponds to, for example, the body portions 5*a* to 5*e*.

In the method of making the piezoelectric element PD1, next, for example, laser light is emitted to form openings for forming the through holes 35*b* to 35*e* and 45*b* to 45*e* in the green sheet. The irradiation with the laser light is performed, for example, twice. For example, the first laser light irradiation forms an opening through which the regions 32*c*, 34*c*, 42*c*, and 44*c* are inserted. For example, the second laser light irradiation forms an opening through which the regions 32*d*, 34*d*, 42*d*, and 44*d* are inserted. The opening through which the regions 32*c*, 34*c*, 42*c*, and 44*c* are inserted and the opening through which the regions 32*d*, 34*d*, 42*d*, and 44*d* are inserted are continuous with each other. For example, the green sheet is irradiated with the laser light such that the degree of increase in the thicknesses of the regions 32*d*, 34*d*, 42*d*, and 44*d* in the first direction D1 is smaller than the degree of increase in the thicknesses of the regions 32*c*, 34*c*, 42*c*, and 44*c* in the first direction D1. The first laser light irradiation may form an opening through which the regions 32*d*, 34*d*, 42*d*, and 44*d* are inserted. The second laser light irradiation may form an opening through which the regions 32*c*, 34*c*, 42*c*, and 44*c* are inserted. The number of times of irradiating the green sheet with the laser beam may be one. The laser light is, for example, YAG laser light.

In the present example, the internal electrodes 30 and 40 are formed. For example, electrode patterns for forming the internal conductors 31 and 41 are formed on a first green sheet for forming the piezoelectric layer 3*a*. Next, a second green sheet for forming the piezoelectric layer 3*b* is laminated on the first green sheet on which the electrode pattern is formed. An opening is formed in the second green sheet through laser irradiation. An opening formed in the second green sheet is filled with a conductive paste for forming the conductor portions 32*b*, 34*b*, 42*b*, and 44*b*. In the present example, the electrically conductive paste is filled in the opening formed in the second green sheet, and an electrode pattern for forming the internal conductors 32 and 42 is formed on the second green sheet. The electrode patterns forming the internal conductors 31, 32, 41, and 42 are formed due to, for example, screen printing using a conductive paste.

The electrically conductive paste forming the conductor portions 32*b*, 34*b*, 42*b*, and 44*b* may include, for example, the first material and the second material. In this case, the conductor portions 32*b*, 34*b*, 42*b*, and 44*b* include regions 32*p*, 34*p*, 42*p*, and 44*p* and regions 32*q*, 34*q*, 42*q*, and 44*q*. The content of the first material included in the electrically conductive paste forming the conductor portions 32*b*, 34*b*, 42*b*, and 44*b* is, for example, 55 mass %. The content of the second material included in the electrically conductive paste is, for example, 10 mass %.

The filled electrically conductive paste is dried at a low temperature of, for example, 60° C. to 75° C. The drying time is, for example, 5 minutes. At least one of the cavity 50 and the recess 51 is formed in the conductor portions 32*b*, 34*b*, 42*b*, and 44*b*. While being dried at a low temperature, the electrically conductive paste forming the conductor portions 32*b*, 34*b*, 42*b*, and 44*b* may, for example, maintain a low viscosity state and form an outer peripheral surface along the shape of the through hole 35*b*. The printed electrode pattern is dried at a high temperature of, for example, 90° C. or higher. The drying time is, for example, one minute. The printed electrode pattern is dried at a high temperature in a short time, and tends not to have an outer peripheral surface along the shape of the through holes 35*b*, 35*d*, 45*b*, and 45*d*.

In the present example, a green sheet for forming the piezoelectric layers 3*c* to 3*e* is filled with a conductive paste into an opening and an electrode pattern is formed in the same process. The respective green sheets with the electrically conductive paste filled in the opening and the electrode pattern formed are laminated to each other.

Next, the laminated green sheets are pressurized through, for example, an isostatic pressing method. The green sheet is pressed in the first direction D1 which is a laminating direction. In the isostatic pressing method, for example, a pressure of 100 MPa is applied. The temperature at the time of pressurization is, for example, about 70° C. The pressurization time is, for example, 5 minutes. After the laminated green sheets are pressurized, a laminate is formed.

Next, for example, the laminate is subjected to a debinding treatment. The temperature for the debinding treatment is, for example, 450° C. The time for the debinding treatment is, for example, about 24 hours. Next, the laminate is sintered to form a laminate base. The temperature at the time of sintering the laminate is, for example, 1100° C. The sintering time is, for example, 18 hours.

When at least one of the cavity 50 and the recess 51 is formed in the conductor portions 32*b*, 34*b*, 42*b*, and 44*b*, the temperature when sintering the laminate is, for example, about 940° C. The sintering time is, for example, 16 hours. The rate of temperature increase is, for example, 450° C./hour. When the sintering temperature of the laminate is the temperature, aggregation of the metal material in the conductor portions 32*b*, 34*b*, 42*b*, and 44*b* is prevented. Therefore, the inert gas remaining in the conductor portions 32*b*, 34*b*, 42*b*, and 44*b* can be sealed in the conductor portions 32*b*, 34*b*, 42*b*, and 44*b*. In the present example, the internal electrodes 30 and 40 are composed of, for example, a sintered body of a conductive paste. The electrically conductive paste for forming the internal electrodes 30 and 40 includes, for example, Ag, Pd, Pt, or the Ag—Pd alloy.

Next, the external electrodes 10 and 20 are composed of a sintered body of the electrically conductive paste together with the internal electrodes 30 and 40, for example. Therefore, in order to form the external electrodes 10 and 20, for example, the electrically conductive paste is applied to the laminated green sheets. The laminated green sheets integrated with the electrically conductive paste are pressurized through, for example, an isostatic pressing method. The laminate formed through pressurization is subjected to, for example, a binder removal treatment and sintering of the laminate. The external electrodes 10 and 20 are formed due to sintering the laminate.

In the present example, the external electrodes 10 and 20 may be formed due to sintering the electrically conductive paste applied to the outer surface of the laminate base. Therefore, for example, the electrically conductive paste for forming the external electrodes 10 and 20 is applied to the outer surface of the laminate base, and the laminate base integrated with the electrically conductive paste is sintered. The external electrodes 10 and 20 are formed due to sintering the laminate base. The electrically conductive paste is applied to the laminate base through, for example, a screen printing method. The electrically conductive paste applied to the outer surface of the laminate base includes, for example, Ag, Pd, or the Ag—Pd alloy. The temperature for sintering the external electrodes 10 and is, for example, 850° C. The sintering time is, for example, two hours.

Next, the piezoelectric body 1 on which the external electrodes 10 and 20 are formed is subjected to a polarization treatment. The temperature at the time of performing the polarization treatment is, for example, 100° C. to 110° C. The voltage applied to the piezoelectric body 1 is, for example, 3 kV/mm. The time for the polarization treatment is about 5 minutes. After the polarization treatment is performed, the piezoelectric element PD1 is made.

As described above, the piezoelectric element PD1 according to the present example includes the piezoelectric body 1, the external electrodes 10 and 20, and the internal electrodes 30 and 40. The internal electrodes 30 and 40 include internal conductors 31, 33, 41, and 43 and internal conductors 32, 34, 42, and 44 opposing each other. The internal conductors 31, 33, 41, and 43 include conductor portions 31*a*, 33*a*, 41*a*, and 43*a* and conductor portions 31*b*, 33*b*, 41*b*, and 43*b* continuous with each other. The internal conductors 32, 34, 42, and 44 include the conductor portions 32*a*, 34*a*, 42*a*, and 44*a* opposing the conductor portions 31*a*, 33*a*, 41*a*, and 43*a* in the first direction D1, the regions 32*c*, 34*c*, 42*c*, and 44*c* connected to the conductor portions 31*b*, 33*b*, 41*b*, and 43*b*, and the conductor portions 42*b*, 44*b*, 32*b*, and 34*b* including the regions 32*d*, 34*d*, 42*d*, and 44*d* continuous with the regions 32*c*, 34*c*, 42*c*, and 44*c* and continuous with the conductor portions 32*a*, 34*a*, 42*a*, and 44*a*. The piezoelectric body 1 includes body portions 5*b* and 5*d* located between the internal conductors 31, 33, 41, and 43 and the internal conductors 32, 34, 42, and 44, and formed with the holes 35*b*, 35*d*, 45*b*, and 45*d* penetrating the body portions 5*b* and 5*d* in the first direction D1. The conductor portions 32*b*, 34*b*, 42*b*, and 44*b* are located in the through holes 35*b*, 35*d*, 45*b*, and 45*d* and have the thicknesses increasing toward the center lines CL1 of the through holes 35*b*, 35*d*, 45*b*, and 45*d*.

In the piezoelectric element PD1, the internal conductors 31, 33, 41, and 43 and the internal conductors 32, 34, 42, and 44 opposing each other are connected to each other with the conductor portions 32*b*, 34*b*, 42*b*, and 44*b*. The conductor portions 32*b*, 34*b*, 42*b*, and 44*b* are continuous with the conductor portions 32*a*, 34*a*, 42*a*, and 44*a* of the internal conductors 32, 34, 42, and 44. The thicknesses of the conductor portions 32*b*, 34*b*, 42*b*, and 44*b* in the first direction D1 increase toward the center lines CL1 of the through holes 35*b*, 35*d*, 45*b*, and 45*d*. Therefore, the shapes of the internal electrodes 30 and 40 are gently changed at locations where the conductor portions 32*b*, 34*b*, 42*b*, and 44*b* and the conductor portions 32*a*, 34*a*, 42*a*, and 44*a* are continuous with each other. Stress affecting the internal electrodes 30 and 40 from the piezoelectric body 1 along with deformation of the piezoelectric body 1 further tends not to concentrate on the portions connected or continuous with each other. A decrease in reliability of electrical connection due to concentration of stress is prevented at the continuous portions. As a result, the reliability of electrical connection at the internal electrodes 30 and 40 is improved.

In the piezoelectric element PD1, the regions 32*c*, 34*c*, 42*c*, and 44*c* have the thicknesses in the first direction D1, and the regions 32*d*, 34*d*, 42*d*, and 44*d* have the thicknesses in the first direction D1. The degree of increase in the thicknesses of the regions 32*d*, 34*d*, 42*d*, and 44*d* is smaller than the degree of increase in the thicknesses of the regions 32*c*, 34*c*, 42*c*, and 44*c*.

In this configuration, the shapes of the internal electrodes 30 and change more gradually at the continuous portions. Stress affecting the internal electrodes 30 and 40 from the piezoelectric body 1 along with deformation of the piezoelectric body 1 further tends not to be concentrated on the continuous portions. As a result, the reliability of electrical connection at the internal electrodes 30 and 40 is further improved.

In the piezoelectric element PD1, the first direction D1 includes a direction D1*a* from the internal conductors 31, 33, 41, and 43 toward the internal conductors 32, 34, 42, and 44, and a direction D1*b* from the internal conductors 32, 34, 42, and 44 toward the internal conductors 31, 33, 41, and 43. The regions 32*d*, 34*d*, 42*d*, and 44*d* include the region portions 32*d*2, 34*d*2, 42*d*2, and 44*d*2 having thicknesses in the direction D1*a* from the reference plane SP1 orthogonal to the first direction D1 and including the conductor portions 32*a*, 34*a*, 42*a*, and 44*a*. The r region portions 32*d*1, 34*d*1, 42*d*1, and 44*d*1 having thicknesses in the direction D1*b* from the reference plane SP1. The thicknesses of the region portions 32*d*1, 34*d*1, 42*d*1, 44*d*1, 32*d*2, 34*d*2, 42*d*2, and 44*d*2 included in the regions 32*d*, 34*d*, 42*d*, and 44*d* in the first direction D1 increase toward the center line CL1.

In this configuration, the shapes of the internal electrodes 30 and change more gradually at the continuous portions. Stress affecting the internal electrodes 30 and 40 from the piezoelectric body 1 along with deformation of the piezoelectric body 1 further tends not to concentrate on the portions connected or continuous with each other. As a result, the reliability of electrical connection at the internal electrodes 30 and 40 is further improved.

In the piezoelectric element PD1, the conductor portions 31*b*, 33*b*, 41*b*, and 43*b* include the outer edges, and the entire outer edges are positioned inside the outer edges of the regions 32*d*, 34*d*, 42*d*, and 44*d* when viewed in the first direction D1.

In this configuration, the outer edges of the regions 32*d*, 34*d*, 42*d*, and 44*d* are positioned farther distant from the center line CL1 when viewed in the first direction D1. The degree of increase in the thickness of the regions 32*d*, 34*d*, 42*d*, and 44*d* in the first direction D1 decreases. The shapes of the internal electrodes 30 and 40 change more gradually at the continuous portions. Stress affecting the internal electrodes 30 and 40 from the piezoelectric body 1 along with deformation of the piezoelectric body 1 further tends not to concentrate on the portions connected or continuous with each other. As a result, the reliability of electrical connection at the internal electrodes 30 and 40 is further improved.

In the piezoelectric element PD1, the 32*d*, 34*d*, 42*d*, and 44*d* are formed with recesses 36 and 46 at the end portions 32*f*, 34*f*, 42*f*, and 44*f* distant from the regions 32*c*, 34*c*, 42*c*, and 44*c* in the first direction D1.

In this configuration, the thickness of the conductor portions 32*b*, 34*b*, 42*b*, and 44*b* in the first direction D1 decreases by the amount of the recesses 36 and 46 formed in the regions 32*d*, 34*d*, 42*d*, and 44*d*. Due to the decrease in thickness, the conductor portions 32*b*, 34*b*, 42*b*, and 44*b* more easily follow the contraction and extension of the conductor portions 32*a*, 34*a*, 42*a*, and 44*a* accompanying deformation of the piezoelectric body 1. Therefore, a decrease in the reliability of electrical connection in the continuous portions is further prevented. As a result, the reliability of electrical connection at the internal electrodes 30 and 40 is further improved.

In the piezoelectric element PD1, the recesses 36 and 46 have the depths increasing toward the center line CL1.

In this configuration, the thicknesses of the conductor portions 32*b*, 34*b*, 42*b*, and 44*b* in the first direction D1 decrease toward the center line CL1. The conductor portions 32*b*, 34*b*, 42*b*, and 44*b* more easily follow contraction and extension of the conductor portions 32*a*, 34*a*, 42*a*, and 44*a* accompanying deformation of the piezoelectric body 1. Therefore, the decrease in the reliability of electrical connection at the continuous portions is further prevented. As a result, the reliability of electrical connection at the internal electrodes 30 and 40 is further improved.

In the piezoelectric element PD1, the conductor portions 31*b*, 33*b*, 41*b*, and 43*b* include the outer edge, and the outer edge is positioned inside the outer peripheral edge of the recesses 36 and 46 when viewed in the first direction D1.

In this configuration, the range in which the thicknesses of the conductor portions 32*b*, 34*b*, 42*b*, and 44*b* in the first direction D1 decrease is further expanded due to the formation of the recesses 36 and 46. Through further expanding the range in which the thickness decreases, the conductor portions 32*b*, 34*b*, 42*b*, and 44*b* more easily follow the contraction and extension of the conductor portions 32*a*, 34*a*, 42*a*, and 44*a* accompanying deformation of the piezoelectric body 1. Therefore, the decrease in the reliability of electrical connection at the continuous portions is further prevented. As a result, the reliability of electrical connection in the internal electrodes 30 and 40 is further improved.

In the piezoelectric element PD1, the regions 32*d*, 34*d*, 42*d*, and 44*d* and the recesses 36 and 46 have a circular shape when viewed in the first direction D1.

In this configuration, the regions 32*d*, 34*d*, 42*d*, and 44*d* more easily follow the contraction and the extension of the conductor portions 32*a*, 34*a*, 42*a*, and 44*a* in the direction intersecting the first direction D1 due to deformation of the piezoelectric body 1. Therefore, the decrease in the reliability of electrical connection at the continuous portions is further prevented. As a result, the reliability of electrical connection at the internal electrodes 30 and 40 is further improved.

In the piezoelectric element PD1, the regions 32*c*, 34*c*, 42*c*, and 44*c* have the length H1 in the direction smaller than the distance H2 between bottoms 36*b* and 46*b* of the recesses 36 and 46 and the conductor portions 31*b*, 33*b*, 41*b*, and 43*b* in the first direction D1.

In this configuration, the conductor portions 32*b*, 34*b*, 42*b*, and 44*b* more easily follow the contraction and extension of the conductor portions 32*a*, 34*a*, 42*a*, and 44*a* accompanying deformation of the piezoelectric body 1. Therefore, the decrease in the reliability of electrical connection at the continuous portions is further prevented. As a result, the reliability of electrical connection at the internal electrodes 30 and 40 is further improved.

In the piezoelectric element, the piezoelectric body expands and contracts and deforms due to a drive signal applied to the electrical conductor. As the piezoelectric body is deformed, the connection portion may also be deformed. When the connection portion is deformed, a crack may generate in the connection portion. When the crack generates in the connection portion, reliability of electrical connection in the electrical conductor is deteriorated. In the electrical conductor in which the reliability of the electrical connection is lowered, stable transmission of the drive signal further tends not to be realized. The electrical conductor corresponds to, for example, the internal electrodes 30 and 40. The connection portion corresponds to, for example, conductor portions 32*b*, 34*b*, 42*b*, and 44*b*.

Therefore, when the conductor portions 32*b*, 34*b*, 42*b*, and 44*b* can be deformed close to deformation of the piezoelectric body 1, the conductor portions 32*b*, 34*b*, 42*b*, and 44*b* reduce the risk of crack generation in the conductor portions 32*b*, 34*b*, 42*b*, and 44*b*. The reduction of the risk of the crack generation increases the resistance of the internal electrodes 30 and 40 to deformation of the piezoelectric body 1.

The piezoelectric element PD1 according to the present example includes the piezoelectric body 1, the external electrodes 10 and 20, and the internal electrodes 30 and 40. The internal electrode 30 includes the internal conductors 31, 33, 41, and 43 and the internal conductors 32, 34, 42, and 44 opposing each other. The internal conductors 32, 34, 42, and 44 include the conductor portions 32*b*, 34*b*, 42*b*, and 44*b* extending in the first direction D1 and connected to the internal conductors 31, 33, 41, and 43. The conductor portions 32*b*, 34*b*, 42*b*, and 44*b* include the regions 32*p*, 34*p*, 42*p*, and 44*p* including a first material having electrical conductivity, and the regions 32*q*, 34*q*, 42*q*, and 44*q* including a second material different from the first material and having a linear expansion coefficient different from the linear expansion coefficient of the first material.

In the piezoelectric element PD1, the internal electrodes 30 and 40 include the internal conductors 31, 33, 41, and 43 and the internal conductors 32, 34, 42, and 44 opposing each other. The internal conductors 32, 34, 42, and 44 include the conductor portions 32*b*, 34*b*, 42*b*, and 44*b* connected to the internal conductors 31, 33, 41, and 43. The conductor portions 32*b*, 34*b*, 42*b*, and 44*b* include the regions 32*p*, 34*p*, 42*p*, and 44*p* including the first material and the regions 32*q*, 34*q*, 42*q*, and 44*q* including the second material. A linear expansion coefficient of the second material is different from a linear expansion coefficient of the first material. Therefore, the linear expansion coefficient of the conductor portions 32*b*, 34*b*, 42*b*, and 44*b* including the regions 32*q*, 34*q*, 42*q*, and 44*q* including the second material can be, for example, close to the linear expansion coefficient of the piezoelectric body 1 as compared with the linear expansion coefficient of the conductor portions 32*b*, 34*b*, 42*b*, and 44*b* including the regions 32*p*, 34*p*, 42*p*, and 44*p* including the first material. Deformation of the conductor portions 32*b*, 34*b*, 42*b*, and 44*b* accompanying deformation of the piezoelectric body 1 approaches deformation of the piezoelectric body 1. As a result, the risk of the crack generation in the conductor portions 32*b*, 34*b*, 42*b*, and 44*b* is reduced, and the resistance of the internal electrodes 30 and 40 to deformation of the piezoelectric body 1 is increased.

When the thicknesses of the conductor portions 32*b*, 34*b*, 42*b*, and 44*b* in the first direction D1 increase toward the center line CL1 of the through holes 35*b*, 35*d*, 45*b*, and 45*d*, the reliability of electrical connection in the internal electrodes 30 and 40 is further improved. That is, as described above, stress affecting the internal electrodes 30 and 40 from the piezoelectric body 1 along with deformation of the piezoelectric body 1 tends not to concentrate on the conductor portions 32*b*, 34*b*, 42*b*, and 44*b*, and in addition, deformation of the conductor portions 32*b*, 34*b*, 42*b*, and 44*b* due to deformation of the piezoelectric body 1 approaches deformation of the piezoelectric body 1 due to the magnitude of the linear expansion coefficient. Therefore, the risk of the crack generation in the conductor portions 32*b*, 34*b*, 42*b*, and 44*b* is more reliably reduced, and the resistance of the internal electrodes 30 and 40 to deformation of the piezoelectric body 1 is further increased. As a result, the reliability of electrical connection at the internal electrodes 30 and 40 is further improved.

In the piezoelectric element PD1, the conductor portions 32*b*, 34*b*, 42*b*, and 44*b* include a plurality of regions 32*q*, 34*q*, 42*q*, and 44*q* including the second material, and the plurality of regions 32*q*, 34*q*, 42*q*, and 44*q* including the second material are distributed in the regions 32*p*, 34*p*, 42*p*, and 44*p* including the first material.

In this case, the linear expansion coefficients of the conductor portions 32*b*, 34*b*, 42*b*, and 44*b* can be closer to the linear expansion coefficient of the piezoelectric body 1, for example, as compared with the linear expansion coefficients of the conductor portions 32*b*, 34*b*, 42*b*, and 44*b* including the regions 32*p*, 34*p*, 42*p*, and 44*p* including the first material. Deformation of the conductor portions 32*b*, 34*b*, 42*b*, and 44*b* accompanying deformation of the piezoelectric body 1 approaches deformation of the piezoelectric body 1. As a result, the risk of the crack generation in the conductor portions 32*b*, 34*b*, 42*b*, and 44*b* is further reduced, and the resistance of the internal electrodes 30 and 40 to deformation of the piezoelectric body 1 is further increased. The reliability of electrical connection at the internal electrodes 30 and 40 is further improved.

In the piezoelectric element PD1, the regions 32*q*, 34*q*, 42*q*, and 44*q* including the second material include the protruding portions 32*r* protruding toward the piezoelectric body 1.

In this configuration, the conductor portions 32*b*, 34*b*, 42*b*, and 44*b* can be in contact with the piezoelectric body 1 via the protruding portions 32*r* of the regions 32*q*, 34*q*, 42*q*, and 44*q* including the second material. Adhesion between the conductor portions 32*b*, 34*b*, 42*b*, and 44*b* and the piezoelectric body 1 is improved. As a result, the risk of the crack generation in the conductor portions 32*b*, 34*b*, 42*b*, and 44*b* is further reduced, and the resistance of the internal electrodes 30 and 40 to deformation of the piezoelectric body 1 is further increased. The reliability of electrical connection at the internal electrodes 30 and 40 is further improved.

In the piezoelectric element PD1, the regions 32*q*, 34*q*, 42*q*, and 44*q* including the second material are located in at least one of the regions 32*c*, 34*c*, 42*c*, and 44*c* and the regions 32*d*, 34*d*, 42*d*, and 44*d*.

In this configuration, the linear expansion coefficient of at least one of the regions 32*c*, 34*c*, 42*c*, and 44*c* and the regions 32*d*, 34*d*, 42*d*, and 44*d* can be close to the linear expansion coefficient of the piezoelectric body 1 as compared with the linear expansion coefficient of the conductor portions 32*b*, 34*b*, 42*b*, and 44*b* including the regions 32*p*, 34*p*, 42*p*, and 44*p* including the first material. Deformation of the regions 32*c*, 34*c*, 42*c*, and 44*c* and the regions 32*d*, 34*d*, 42*d*, and 44*d* due to deformation of the piezoelectric body 1 approaches deformation of the piezoelectric body 1. As a result, the risk of the crack generation in the region 32*c* and the regions 32*d*, 34*d*, 42*d*, and 44*d* is reduced, and the resistance of the internal electrode 30 to deformation of the piezoelectric body 1 is further increased. The reliability of electrical connection at the internal electrode 30 is further improved.

In the piezoelectric element PD1, the regions 32*q*, 34*q*, 42*q*, and 44*q* including the second material are located in the regions 32*s*, 34*s*, 42*s*, and 44*s* including the surfaces defining the recesses 36 and 46 in the regions 32*d*, 34*d*, 42*d*, and 44*d*.

In this configuration, peeling between the recesses 36 and 46 and the piezoelectric body 1 can be prevented. As a result, the reliability of electrical connection at the internal electrodes 30 and 40 is further improved.

In a piezoelectric element, stress from the piezoelectric body may affect an electrical conductor as the piezoelectric body is deformed. Stress applied from the piezoelectric body may be concentrated on the connection portion. When stress applied from the piezoelectric body concentrates on the connection portion, the crack may generate in the connection portion. When the crack generates in the connection portion, reliability of electrical connection in the electrical conductor is deteriorated. In the electrical conductor in which the reliability of the electrical connection is decreased, stable transmission of the drive signal tends not to be realized. The electrical conductor corresponds to, for example, the internal electrodes 30 and 40. The connection portion corresponds to, for example, conductor portions 32*b*, 34*b*, 42*b*, and 44*b*.

Therefore, in the configuration in which the conductor portions 32*b*, 34*b*, 42*b*, and 44*b* can be deformed, even when stress affecting from the piezoelectric body 1 affects the connection portion, the conductor portions 32*b*, 34*b*, 42*b*, and 44*b* reduce the risk of crack generation in the conductor portions 32*b*, 34*b*, 42*b*, and 44*b*. The reduction of the risk of the crack generation further increases the resistance of the internal electrodes 30 and 40 to stress affecting from the piezoelectric body 1.

The piezoelectric element PD1 according to the present example includes the piezoelectric body 1, the external electrodes 10 and 20, and the internal electrodes 30 and 40. The internal electrodes 30 and 40 include internal conductors 31, 33, 41, and 43 and internal conductors 32, 34, 42, and 44 opposing each other. The internal conductors 32, 34, 42, and 44 include the conductor portions 32*b*, 34*b*, 42*b*, and 44*b* extending in the first direction D1 and connected to the internal conductors 31, 33, 41, and 43. The cavity 50 is formed in the conductor portions 32*b*, 34*b*, 42*b*, and 44*b*.

In the piezoelectric element PD1, the internal electrodes 30 and 40 include the internal conductors 31, 33, 41, and 43 and the internal conductors 32, 34, 42, and 44 opposing each other. The internal conductors 32, 34, 42, and 44 include the conductor portions 32*b*, 34*b*, 42*b*, and 44*b* connected to the internal conductors 31, 33, 41, and 43. The cavity 50 is formed in the conductor portions 32*b*, 34*b*, 42*b*, and 44*b*. Since the conductor portions 32*b*, 34*b*, 42*b*, and 44*b* in which the cavity 50 is formed include the cavity 50 as compared with the conductor portions 32*b*, 34*b*, 42*b*, and 44*b* in which the cavity 50 is not formed, a dense sintered body tends not to be constituted as a whole. The conductor portions 32*b*, 34*b*, 42*b*, and 44*b* in which the cavity 50 is formed are more easily deformed than the conductor portions 32*b*, 34*b*, 42*b*, and 44*b* in which the cavity 50 is not formed. Therefore, when stress from the piezoelectric body 1 affects the conductor portions 32*b*, 34*b*, 42*b*, and 44*b* along with deformation of the piezoelectric body 1, the crack tends not to generate in the conductor portions 32*b*, 34*b*, 42*b*, and 44*b*. As a result, the resistance of the internal electrodes 30 and 40 to stress applied from the piezoelectric body 1 increases.

As described above, when the thicknesses of the conductor portions 32*b*, 34*b*, 42*b*, and 44*b* in the first direction D1 increase toward the center line CL1 of the through holes 35*b*, 35*d*, 45*b*, and 45*d*, the reliability of electrical connection at the internal electrodes 30 and 40 is further improved. When the cavity 50 is formed in the conductor portions 32*b*, 34*b*, 42*b*, and 44*b*, the crack tends not to generate in the conductor portions 32*b*, 34*b*, 42*b*, and 44*b* than in the conductor portions 32*b*, 34*b*, 42*b*, and 44*b* in which the cavity 50 is not formed. As a result, the risk of the crack generation in the conductor portions 32*b*, 34*b*, 42*b*, and 44*b* is reliably reduced, and the resistance of the internal electrodes 30 and 40 to deformation of the piezoelectric body 1 is increased. As a result, the reliability of electrical connection at the internal electrodes 30 and 40 is further improved.

In the piezoelectric element PD1, in a cut surface obtained due to cutting the conductor portions 32*b*, 34*b*, 42*b*, and 44*b* in a plane extending in the first direction D1 and including the cavity 50, the equivalent circle diameter R1 in the cut surface of the cavity 50 is 50% or less of the width R2 in the cut surface of the conductor portions 32*b*, 34*b*, 42*b*, and 44*b*.

In this configuration, electrical disconnection due to the formation of the cavity 50 in the conductor portions 32*b*, 34*b*, 42*b*, and 44*b* tends not to occur. Stable transmission of a drive signal through the conductor portions 32*b*, 34*b*, 42*b*, and 44*b* is realized, and reliability of electrical connection in the internal electrodes 30 and 40 is further improved.

In the piezoelectric element PD1, the cross section of the cavity 50 has a polygonal shape.

In this configuration, since the surface defining the cavity 50 includes a plurality of corners and ridges, the conductor portions 32*b*, 34*b*, 42*b*, and 44*b* are easily deformed due to deformation of the piezoelectric body 1. The conductor portions 32*b*, 34*b*, 42*b*, and 44*b* further tend not to be cracked. As a result, the resistance of the internal electrodes 30 and 40 to stress applied from the piezoelectric body 1 further increases. The reliability of electrical connection at the internal electrodes 30 and 40 is further improved.

In the piezoelectric element PD1, the cavity 50 is formed in at least one of the regions 32*c*, 34*c*, 42*c*, and 44*c* and the regions 32*d*, 34*d*, 42*d*, and 44*d*.

In this configuration, at least one of the regions 32*c*, 34*c*, 42*c*, and 44*c* and the regions 32*d*, 34*d*, 42*d*, and 44*d* is easily deformed. The crack further tends not to generate in the regions 32*c*, 34*c*, 42*c*, 44*c*, 32*d*, 34*d*, 42*d*, and 44*d*. As a result, the resistance of the internal electrodes 30 and 40 to stress applied from the piezoelectric body 1 further increases.

In the piezoelectric element PD1, the cavity 50 is formed in regions 32*s*, 34*s*, 42*s*, and 44*s* including surfaces defining the recesses 36 and 46 in the regions 32*d*, 34*d*, 42*d*, and 44*d*.

In this configuration, peeling-off of the recesses 36 and 46 from the piezoelectric body 1 can be prevented. As a result, the reliability of electrical connection at the internal electrodes 30 and 40 is further improved.

In the piezoelectric element PD1, the conductor portions 32*b*, 34*b*, 42*b*, and 44*b* are formed with recesses 51 opened at the outer peripheral surfaces of the conductor portions 32*b*, 34*b*, 42*b*, and 44*b*.

In this configuration, the outer peripheral surface in which the recess 51 is formed tends not to reflect the vibration transmitted from the piezoelectric body 1 than the outer peripheral surface in which the recess 51 is not formed. Therefore, vibration accompanying deformation of the piezoelectric body 1 is easily transmitted in the piezoelectric body 1, and the resonance characteristics of the piezoelectric element PD1 are improved.

The piezoelectric element PD1 includes a piezoelectric body 1, external electrodes 10 and 20, and internal electrodes 30 and 40. The internal electrodes 30 and 40 include an internal conductor 31 and an internal conductor 32 opposing each other. The internal conductors 32, 34, 42, and 44 include the conductor portions 32*b*, 34*b*, 42*b*, and 44*b* extending in the first direction D1 and connected to the internal conductors 31, 33, 41, and 43. The recesses 51 are formed in the conductor portions 32*b*, 34*b*, 42*b*, and 44*b*.

In the piezoelectric element PD1, the internal electrodes 30 and 40 include the internal conductors 31, 33, 41, and 43 and the internal conductors 32, 34, 42, and 44 opposing each other. The internal conductors 32, 34, 42, and 44 include a conductor portion 32*b* connected to the internal conductors 31, 33, 41, and 43. In the conductor portions 32*b*, 34*b*, 42*b*, and 44*b*, the recesses 51 opened at the outer peripheral surfaces of the conductor portions 32*b*, 34*b*, 42*b*, and 44*b* are formed. The conductor portions 32*b*, 34*b*, 42*b*, and 44*b* in which the recess 51 is formed tend not to be cracked than the conductor portions 32*b*, 34*b*, 42*b*, and 44*b* in which the cavity 50 is not formed. The resistance of the internal electrodes 30 and 40 to stress applied from the piezoelectric body 1 increases. Reliability of electrical connection in the internal electrodes 30 and 40 is improved.

In the present example, in a case where at least one of the recess 51 and the cavity 50 is formed in the conductor portions 32*b*, 34*b*, 42*b*, and 44*b*, and the conductor portions 32*b*, 34*b*, 42*b*, and 44*b* include the regions 32*q*, 34*q*, 42*q*, and 44*q* including the second material, the reliability is further improved. When the conductor portions 32*b*, 34*b*, 42*b*, and 44*b* include regions 32*q*, 34*q*, 42*q*, and 44*q* including the second material, the conductor portions 32*b*, 34*b*, 42*b*, and 44*b* have lower sintering temperatures. Therefore, the crack tends not to generate in the conductor portions 32*b*, 34*b*, 42*b*, and 44*b* than in the conductor portions 32*b*, 34*b*, 42*b*, and 44*b* in which the cavity 50 is not formed. Reliability of electrical connection in the internal electrodes 30 and 40 is improved.

Although the examples of the present disclosure have been described above, the present disclosure is not necessarily limited to the above-described examples, and various modifications can be made without departing from the gist thereof.

In the piezoelectric element PD1, the regions 32*c*, 34*c*, 42*c*, and 44*c* may have the thicknesses in the first direction D1, and the regions 32*d*, 34*d*, 42*d*, and 44*d* may have the thicknesses in the first direction D1. The degree of increase in the thicknesses of the regions 32*d*, 34*d*, 42*d*, and 44*d* in the first direction D1 may not be smaller than the degree of increase in the thicknesses of the regions 32*c*, 34*c*, 42*c*, and 44*c* in the first direction D1. In the configuration in which the degree of increase in the thicknesses of the regions 32*d*, 34*d*, 42*d*, and 44*d* in the first direction D1 is smaller than the degree of increase in the thicknesses of the regions 32*c*, 34*c*, 42*c*, and 44*c* in the first direction D1, as described above, the shapes of the internal electrodes 30 and 40 change more gradually at the portions where the conductor portions 32*b*, 34*b*, 42*b*, and 44*b* and the conductor portions 32*a*, 34*a*, 42*a*, and 44*a* are continuous with each other. Stress affecting the internal electrodes 30 and 40 from the piezoelectric body 1 along with deformation of the piezoelectric body 1 further tends not to concentrate on the continuous portions. As a result, the reliability of electrical connection at the internal electrodes 30 and 40 is further improved.

In the piezoelectric element PD1, the thicknesses of the region portions 32*d*1, 34*d*1, 42*d*1, 44*d*1, 32*d*2, 34*d*2, 42*d*2, and 44*d*2 included in the regions 32*d*, 34*d*, 42*d*, and 44*d* in the first direction D1 may not increase toward the center line CL1. In the configuration in which the thicknesses in the first direction D1 of the region portions 32*d*1, 34*d*1, 42*d*1, 44*d*1, 32*d*2, 34*d*2, 42*d*2, and 44*d*2 included in the regions 32*d*, 34*d*, 42*d*, and 44*d* increase toward the center line CL1, as described above, the shapes of the internal electrodes 30 and 40 further gradually change at the locations where the conductor portions 32*b*, 34*b*, 42*b*, and 44*b* and the conductor portions 32*a*, 34*a*, 42*a*, and 44*a* are continuous with each other. Stress affecting the internal electrodes 30 and 40 from the piezoelectric body 1 along with deformation of the piezoelectric body 1 tends not to concentrate on the portions connected or continuous with each other. As a result, the reliability of electrical connection at the internal electrodes 30 and 40 is further improved.

In the piezoelectric element PD1, the conductor portions 31*b*, 33*b*, 41*b*, and 43*b* may not include an outer edge that is positioned inside an outer edge of the regions 32*d*, 34*d*, 42*d*, and 44*d* when viewed in the first direction D1. In the configuration in which the conductor portions 31*b*, 33*b*, 41*b*, and 43*b* include the outer edges, and the entire outer edges are positioned inside the outer edges of the regions 32*d*, 34*d*, 42*d*, and 44*d* when viewed in the first direction D1, as described above, the outer edges of the regions 32*d*, 34*d*, 42*d*, and 44*d* are positioned farther distant from the center line CL1 when viewed in the first direction D1. The degree of increase in the thickness of the regions 32*d*, 34*d*, 42*d*, and 44*d* in the first direction D1 decreases. The shapes of the internal electrodes 30 and 40 change more gradually at locations where the conductor portions 32*b*, 34*b*, 42*b*, and 44*b* and the conductor portions 32*a*, 34*a*, 42*a*, and 44*a* are continuous with each other. Stress affecting the internal electrodes 30 and from the piezoelectric body 1 along with deformation of the piezoelectric body 1 further tends not to concentrate on the portions connected or continuous with each other. As a result, the reliability of electrical connection at the internal electrodes 30 and 40 is further improved.

In the piezoelectric element PD1, the 32*d*, 34*d*, 42*d*, and 44*d* may not be formed with recesses 36 and 46 at the end portions 32*f*, 34*f*, 42*f*, and 44*f* distant from the regions 32*c*, 34*c*, 42*c*, and 44*c* in the first direction D1. In the configuration in which the 32*d*, 34*d*, 42*d*, and 44*d* are formed with recesses 36 and 46 at the end portions 32*f*, 34*f*, 42*f*, and 44*f* distant from the regions 32*c*, 34*c*, 42*c*, and 44*c* in the first direction D1, as described above, the thicknesses of the conductor portions 32*b*, 34*b*, 42*b*, and 44*b* in the first direction D1 decrease by the recesses 36 and 46 formed in the regions 32*d*, 34*d*, 42*d*, and 44*d*. Due to the decrease in thickness, the conductor portions 32*b*, 34*b*, 42*b*, and 44*b* more easily follow the contraction and extension of the conductor portions 32*a*, 34*a*, 42*a*, and 44*a* accompanying deformation of the piezoelectric body 1. Therefore, a decrease in the reliability of electrical connection at locations where the conductor portions 32*b*, 34*b*, 42*b*, and 44*b* and the conductor portions 32*a*, 34*a*, 42*a*, and 44*a* are continuous with each other is further prevented. As a result, the reliability of electrical connection at the internal electrodes 30 and 40 is further improved.

In the piezoelectric element PD1, the recesses 36 and 46 may not have the depths increasing toward the center line CL1. In the configuration in which the recesses 36 and 46 have the depths increasing toward the center line CL1, as described above, the thicknesses of the conductor portions 32*b*, 34*b*, 42*b*, and 44*b* in the first direction D1 decrease toward the center line CL1, and the conductor portions 32*b*, 34*b*, 42*b*, and 44*b* more easily follow the contraction and extension of the conductor portions 32*a*, 34*a*, 42*a*, and 44*a* accompanying deformation of the piezoelectric body 1. Therefore, the decrease in the reliability of electrical connection at the continuous portions is further prevented. As a result, the reliability of electrical connection at the internal electrodes 30 and 40 is further improved.

In the piezoelectric element PD1, the conductor portions 31*b*, 33*b*, 41*b*, and 43*b* may not include the outer edge that is positioned inside the outer peripheral edge of the recesses 36 and 46 when viewed in the first direction D1. In the configuration in which the conductor portions 31*b*, 33*b*, 41*b*, and 43*b* include the outer edge, and the outer edge is positioned inside the outer peripheral edge of the recesses 36 and 46 when viewed in the first direction D1, as described above, the range in which the thicknesses of the conductor portions 32*b*, 34*b*, 42*b*, and 44*b* in the first direction D1 are reduced through the formation of the recesses 36 and 46 is further expanded. Due to further expanding the range in which the thickness decreases, the conductor portions 32*b*, 34*b*, 42*b*, and 44*b* more easily follow the contraction and extension of the conductor portions 32*a*, 34*a*, 42*a*, and 44*a* accompanying deformation of the piezoelectric body 1. Therefore, the decrease in the reliability of electrical connection at the continuous portions is further prevented. As a result, the reliability of electrical connection in the internal electrodes 30 and 40 is further improved.

In the piezoelectric element PD1, the regions 32*d*, 34*d*, 42*d*, and 44*d* and the recesses 36 and 46 may not have a circular shape when viewed in the first direction D1. In the configuration in which the regions 32*d*, 34*d*, 42*d*, and 44*d* and the recesses 36 and 46 have a circular shape when viewed in the first direction D1, as described above, the regions 32*d*, 34*d*, 42*d*, and 44*d* easily follow the contraction and the extension in the direction intersecting the first direction D1 of the conductor portions 32*a*, 34*a*, 42*a*, and 44*a* accompanying deformation of the piezoelectric body 1. Therefore, the decrease in the reliability of electrical connection at the continuous portions is further prevented. As a result, the reliability of electrical connection at the internal electrodes 30 and 40 is further improved.

In the piezoelectric element PD1, the regions 32*c*, 34*c*, 42*c*, and 44*c* may not have the length H1 in the direction smaller than a distance H2 between bottoms 36*b* and 46*b* of the recesses 36 and 46 and the conductor portions 31*b*, 33*b*, 41*b*, and 43*b* in the first direction D1. In the configuration in the regions 32*c*, 34*c*, 42*c*, and 44*c* have the length H1 in the direction smaller than the distance H2 between bottoms 36*b* and 46*b* of the recesses 36 and 46 and the conductor portions 31*b*, 33*b*, 41*b*, and 43*b* in the first direction D1, as described above, the conductor portions 32*b*, 34*b*, 42*b*, and 44*b* more easily follow the contraction and extension of the conductor portions 32*a*, 34*a*, 42*a*, and 44*a* accompanying deformation of the piezoelectric body 1. Therefore, the decrease in the reliability of electrical connection at the continuous portions is further prevented. As a result, the reliability of electrical connection at the internal electrodes 30 and 40 is further improved.

In the piezoelectric element PD1, the conductor portions 32*b*, 34*b*, 42*b*, and 44*b* may not include the regions 32*q*, 34*q*, 42*q*, and 44*q* including the second material. The configuration in which the conductor portions 32*b*, 34*b*, 42*b*, and 44*b* include the regions 32*q*, 34*q*, 42*q*, and 44*q* including the second material further improves the reliability of electrical connection in the internal electrodes 30 and 40 as described above.

In the piezoelectric element PD1, the cavity 50 may not be formed in the conductor portions 32*b*, 34*b*, 42*b*, and 44*b*. The configuration in which the cavity 50 is formed in the conductor portions 32*b*, 34*b*, 42*b*, and 44*b* further improves the reliability of electrical connection in the internal electrodes 30 and 40 as described above.

In the piezoelectric element PD1, the recess 51 opened at the outer peripheral surface of the conductor portions 32*b*, 34*b*, 42*b*, and 44*b* may not be formed in the conductor portions 32*b*, 34*b*, 42*b*, and 44*b*. In the configuration in which the recess 51 opened at the outer peripheral surface of the conductor portions 32*b*, 34*b*, 42*b*, and 44*b* is formed in the conductor portions 32*b*, 34*b*, 42*b*, and 44*b*, as described above, the vibration accompanying deformation of the piezoelectric body 1 is easily transmitted in the piezoelectric body 1, and the resonance characteristic of the piezoelectric element PD1 is improved.

What is claimed is:

1. A piezoelectric element comprising:

a piezoelectric body;

an external electrode disposed on an outer surface of the piezoelectric body; and an internal electrode connected to the external electrode and disposed in the piezoelectric body, wherein the internal electrode includes a first internal conductor and a second internal conductor opposing each other, the first internal conductor includes a first conductor portion and a second conductor portion continuous with each other, the second internal conductor includes:

a third conductor portion opposing the first conductor portion in a direction where the first internal conductor and the second internal conductor oppose each other; and a fourth conductor portion including a first region connected to the second conductor portion and a second region continuous with the first region and continuous with the third conductor portion, the piezoelectric body includes a body portion located between the first internal conductor and the second internal conductor and formed with a through hole penetrating the body portion in the direction, the fourth conductor portion is located in the through hole and has a thickness increasing toward a center line of the through hole, the direction includes a first direction from the first internal conductor toward the second internal conductor and a second direction from the second internal conductor toward the first internal conductor, the second region includes a region portion having a thickness in the first direction from a reference plane orthogonal to the direction and including the third conductor portion, and a region portion having a thickness in the second direction from the reference plane, and a thickness of each of the region portions included in the second region in the direction increases toward the center line.

2. The piezoelectric element according to claim 1, wherein the first region has a first thickness in the direction, the second region has a second thickness in the direction, and a degree of increase in the second thickness is smaller than a degree of increase in the first thickness.

3. The piezoelectric element according to claim 1, wherein the second conductor portion includes an outer edge, and the entire outer edge is positioned inside an outer edge of the second region when viewed in the direction.

4. The piezoelectric element according to claim 1, wherein the second region is formed with a recess at an end portion distant from the first region in the direction.

5. The piezoelectric element according to claim 4, wherein the recess has a depth increasing toward the center line.

6. The piezoelectric element according to claim 4, wherein the second conductor portion includes an outer edge, and the outer edge is positioned inside an outer peripheral edge of the recess when viewed in the direction.

7. The piezoelectric element according to claim 4, wherein the second region and the recess have a circular shape when viewed in the direction.

8. The piezoelectric element according to claim 4, wherein the first region has a length in the direction smaller than a distance between a bottom of the recess and the second conductor portion in the direction.

9. The piezoelectric element according to claim 1, wherein the fourth conductor portion includes a region including a first material, and at least one region including a second material, and the first material has a first linear expansion coefficient, and the second material has a second linear expansion coefficient different from the first linear expansion coefficient.

10. The piezoelectric element according to claim 9, wherein the at least one region includes a plurality of regions including the second material that are distributed in the region including the first material.

11. The piezoelectric element according to claim 1, wherein the fourth conductor portion is formed with a cavity.

12. The piezoelectric element according to claim 11, wherein an equivalent circle diameter in the cross section of the cavity is 50% or less of a width in the cross section of the fourth conductor portion.

13. A piezoelectric element comprising:

a piezoelectric body;

an external electrode disposed on an outer surface of the piezoelectric body; and an internal electrode connected to the external electrode and disposed in the piezoelectric body, wherein the internal electrode includes a first internal conductor and a second internal conductor opposing each other, the first internal conductor includes a first conductor portion and a second conductor portion continuous with each other, the second internal conductor includes:

a third conductor portion opposing the first conductor portion in a direction where the first internal conductor and the second internal conductor oppose each other; and a fourth conductor portion including a first region connected to the second conductor portion and a second region continuous with the first region and continuous with the third conductor portion, the piezoelectric body includes a body portion located between the first internal conductor and the second internal conductor and formed with a through hole penetrating the body portion in the direction, the fourth conductor portion is located in the through hole and has a thickness increasing toward a center line of the through hole, the fourth conductor portion includes a region including a first material, and at least one region including a second material, and the first material has a first linear expansion coefficient, and the second material has a second linear expansion coefficient different from the first linear expansion coefficient.

14. The piezoelectric element according to claim 13, wherein the first region has a first thickness in the direction, the second region has a second thickness in the direction, and a degree of increase in the second thickness is smaller than a degree of increase in the first thickness.

15. The piezoelectric element according to claim 13, wherein the second conductor portion includes an outer edge, and the entire outer edge is positioned inside an outer edge of the second region when viewed in the direction.

16. The piezoelectric element according to claim 13, wherein the second region is formed with a recess at an end portion distant from the first region in the direction.

17. The piezoelectric element according to claim 16, wherein the recess has a depth increasing toward the center line.

18. The piezoelectric element according to claim 16, wherein the second conductor portion includes an outer edge, and the outer edge is positioned inside an outer peripheral edge of the recess when viewed in the direction.

19. The piezoelectric element according to claim 16, wherein the second region and the recess have a circular shape when viewed in the direction.

20. The piezoelectric element according to claim 16, wherein the first region has a length in the direction smaller than a distance between a bottom of the recess and the second conductor portion in the direction.

21. The piezoelectric element according to claim 13, wherein the at least one region includes a plurality of regions including the second material that are distributed in the region including the first material.

22. The piezoelectric element according to claim 13, wherein the fourth conductor portion is formed with a cavity.

23. The piezoelectric element according to claim 22, wherein an equivalent circle diameter in the cross section of the cavity is 50% or less of a width in the cross section of the fourth conductor portion.

* * * * *